US009585265B2

(12) United States Patent
Ganim et al.

(10) Patent No.: US 9,585,265 B2
(45) Date of Patent: Feb. 28, 2017

(54) SUPPORT ASSEMBLY FOR VEHICLE MOUNTED DISPLAY

(71) Applicant: Prophet Signs, Inc., Greensboro, NC (US)

(72) Inventors: Sam M. Ganim, Greensboro, NC (US); Lon Cecil, High Point, NC (US)

(73) Assignee: Prophet Signs, Inc., Greensboro, NC (US)

( * ) Notice: Subject to any disclaimer, the term of this patent is extended or adjusted under 35 U.S.C. 154(b) by 218 days.

(21) Appl. No.: 14/231,120

(22) Filed: Mar. 31, 2014

(65) Prior Publication Data

US 2015/0282346 A1    Oct. 1, 2015

(51) Int. Cl.
*G09F 21/00* (2006.01)
*H05K 5/02* (2006.01)
*G09F 13/22* (2006.01)
*G09F 21/04* (2006.01)
*G09F 7/20* (2006.01)
*G09F 7/22* (2006.01)
*G09F 9/33* (2006.01)
*G06Q 30/02* (2012.01)
*G09F 3/20* (2006.01)
*G09F 27/00* (2006.01)

(52) U.S. Cl.
CPC ....... *H05K 5/0204* (2013.01); *G06Q 30/0265* (2013.01); *G09F 7/20* (2013.01); *G09F 7/22* (2013.01); *G09F 9/33* (2013.01); *G09F 13/22* (2013.01); *G09F 21/04* (2013.01); *G09F 21/048* (2013.01); *H05K 5/0226* (2013.01); *G09F 3/203* (2013.01); *G09F 27/005* (2013.01); *G09F 2013/222* (2013.01); *G09F 2013/227* (2013.01)

(58) Field of Classification Search
CPC . G09F 7/12; G09F 19/22; G09F 21/04; G09F 2007/127; G09F 3/10
See application file for complete search history.

(56) References Cited

U.S. PATENT DOCUMENTS

| | | | | |
|---|---|---|---|---|
| 2,454,224 | A * | 11/1948 | Shook, Jr. ................. | F16G 3/02 24/33 B |
| 4,625,369 | A * | 12/1986 | Musil ........................ | F16G 3/04 24/33 B |
| 7,848,093 | B2 * | 12/2010 | Hardson ............... | A44B 11/001 224/163 |
| 2013/0221189 | A1 * | 8/2013 | Kubin .................... | F16M 13/04 248/683 |

* cited by examiner

*Primary Examiner* — Cassandra Davis
(74) *Attorney, Agent, or Firm* — Ed Garcia-Otera

(57) ABSTRACT

A display panel assembly includes a display panel including an array of LED (Light Emitting Diode) pixels, and includes a support assembly configured to hold the display panel near the rear window of the vehicle. In one embodiment, the support assembly for holding the display panel in the vehicle includes a first strap and a first hinge. The first hinge includes: a first flap having a first hole; a pivot; and a second flap having a second hole and a third hole. The first strap includes a fourth hole and a fifth hole located at a hinge end of the strap, and a sixth hole located at a cross beam end of the strap.

4 Claims, 24 Drawing Sheets

SUPPORT ASSEMBLY WITH HINGE

VEHICLE WITH DISPLAY PANEL

SUPPORT ASSEMBLY

SUPPORT ASSEMBLY WITH HINGE

STRAP PORTIONS

HINGE FASTENER DETAILS

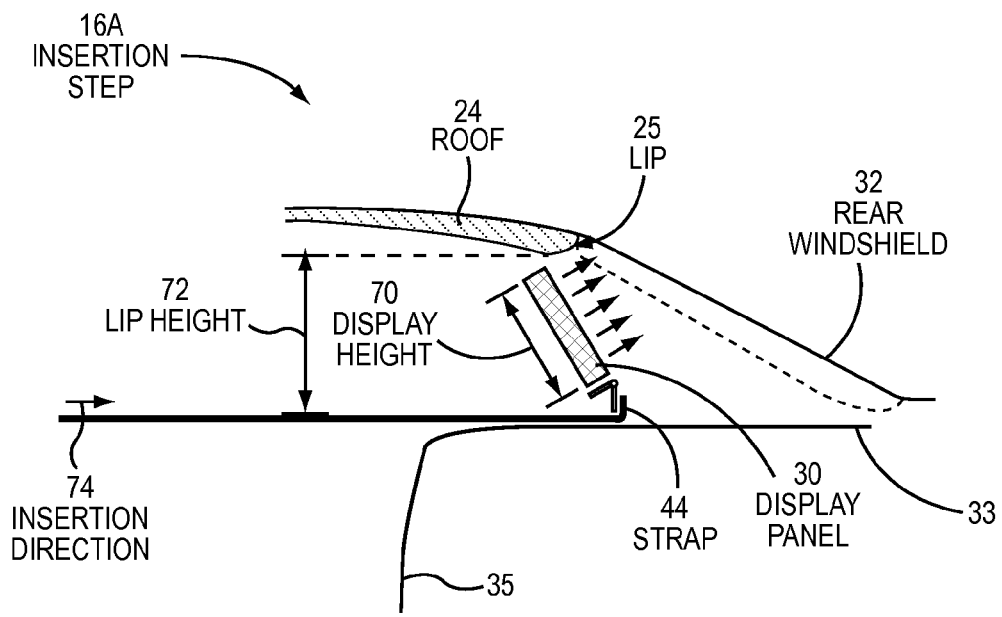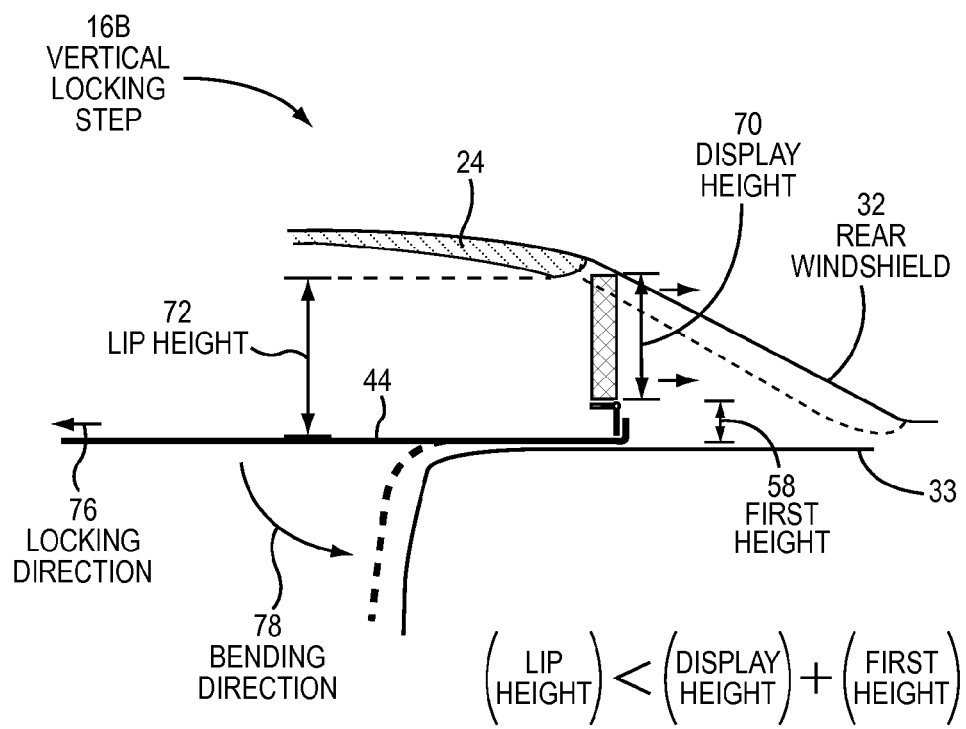
FIG. 6A
SUPPORT ASSEMBLY WITH HINGE

SUPPORT ASSEMBLY WITH HINGE

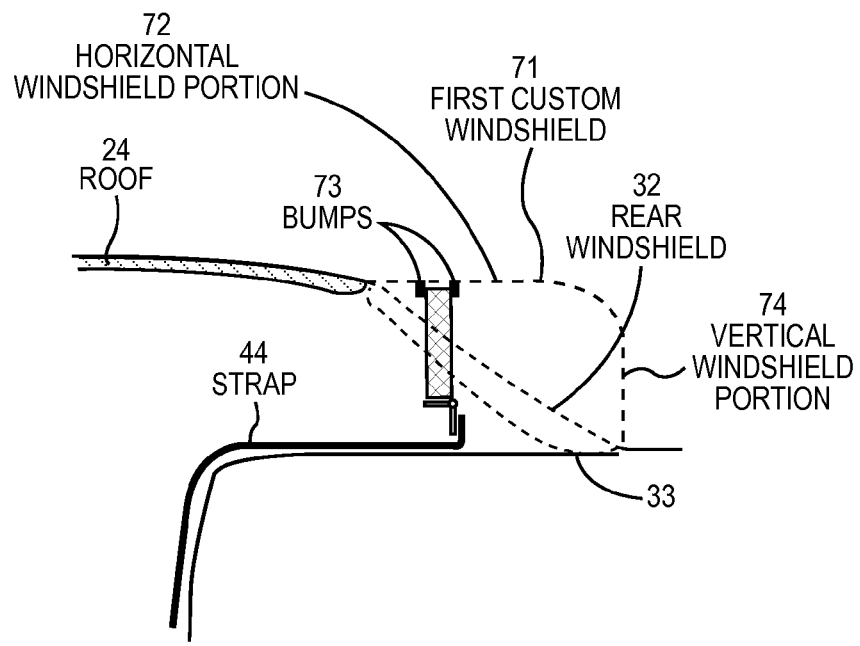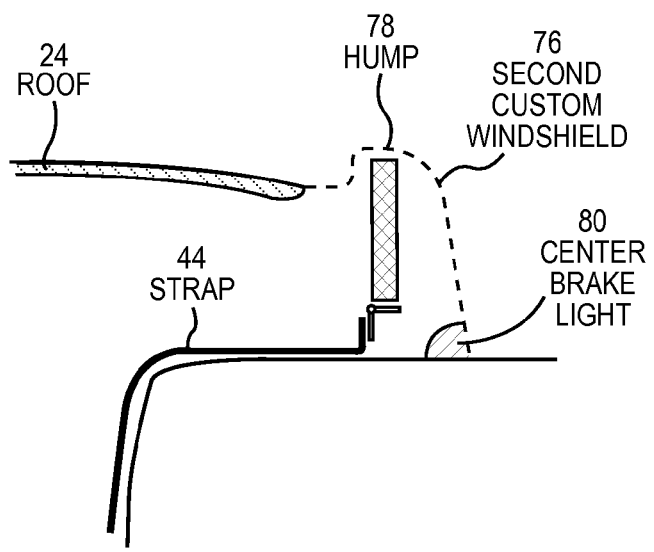
*FIG. 7*
CUSTOM WINDSHIELDS

DISPLAY PANEL DETAILS

ROOF BEAM DETAILS

SAMPLE ADVERTISEMENT

STRAP DETAIL

MULTIPLE BENDS

MOBILE MEDIA DISPLAY SYSTEM

LED DISPLAY (5X3 ARRAY OF LED MODULES)

LED MODULE (32X16 ARRAY OF LED PIXELS)

LED PIXEL

LED DISPLAY POWER DISTRIBUTION

ELECTRONIC CIRCUIT

FIRST SET OF COMMUNICATIONS

SECOND SET OF COMMUNICATIONS
(REGULAR REQUESTS)

THIRD SET OF COMMUNICATIONS
(PREDICTIVE REQUESTS)

SUPPORT ASSEMBLY FOR VEHICLE MOUNTED DISPLAY

FIELD OF THE DISCLOSURE

The field of the disclosure is support assemblies for displays. Specifically, the field of the disclosure is support assemblies for displays that are mounted in a vehicle and visible through the rear window of the vehicle.

BACKGROUND

It is difficult to mount a display near the rear window of a vehicle. There are no structural elements readily accessible for attachment.

In one conventional approach, a support assembly for a small, light sign may be attached directly to the horizontal surface near the rear windshield.

For example, U.S. Pat. No. 6,178,677 B1 by Williams provides a support assembly in FIG. 1 that includes: a lock nut 37, an externally threaded strut 40, an internally treaded cylindrical riser member 42, support base plate 44, and base-plate-to-vehicle fasteners 46. One support assembly is located on the left of the display, and another support assembly is located on the right of the display.

Base-plate-to-vehicle fasteners 46 bolt the support assembly down to horizontal surface 46. However, in most vehicles, the horizontal surface near the rear window is very flimsy, and is not structural. Thus, this horizontal surface generally cannot bear the weight of a large display on the small support base plates. In the event of a crash, the display will likely break loose and injure passengers.

Further, the Williams support assembly extends outwards away from the display (towards the sides of the vehicle), and this reduces the maximum width of the display.

If the Williams support assembly is removed, then unsightly holes from the base-plate-to-vehicle fasteners will remain in the horizontal surface, thus decreasing the market value of the vehicle.

Thus, it is desirable to design a support assembly that remedies the above problems while providing increased stability.

SUMMARY

In one embodiment, a display panel assembly includes a display panel including an array of LED (Light Emitting Diode) pixels, and a support assembly configured to hold the display panel near the rear window of the vehicle.

In one embodiment, a support assembly for holding a display panel in a vehicle includes a first hinge and a first strap fastened to the first hinge. The first hinge includes: a first flap having a first hole, a pivot, and a second flap having a second hole and a third hole. The first strap includes a fourth hole and a fifth hole located at a hinge end of the strap, and a sixth hole located at a cross beam end of the strap.

In one embodiment, a support assembly contains a first strap and a first hinge as described above, a second strap similar to the first strap, and a second hinge similar to the first hinge.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 6A and 6B illustrate a mounting procedure.

FIG. 7 illustrates custom windshields.

Figure 21:
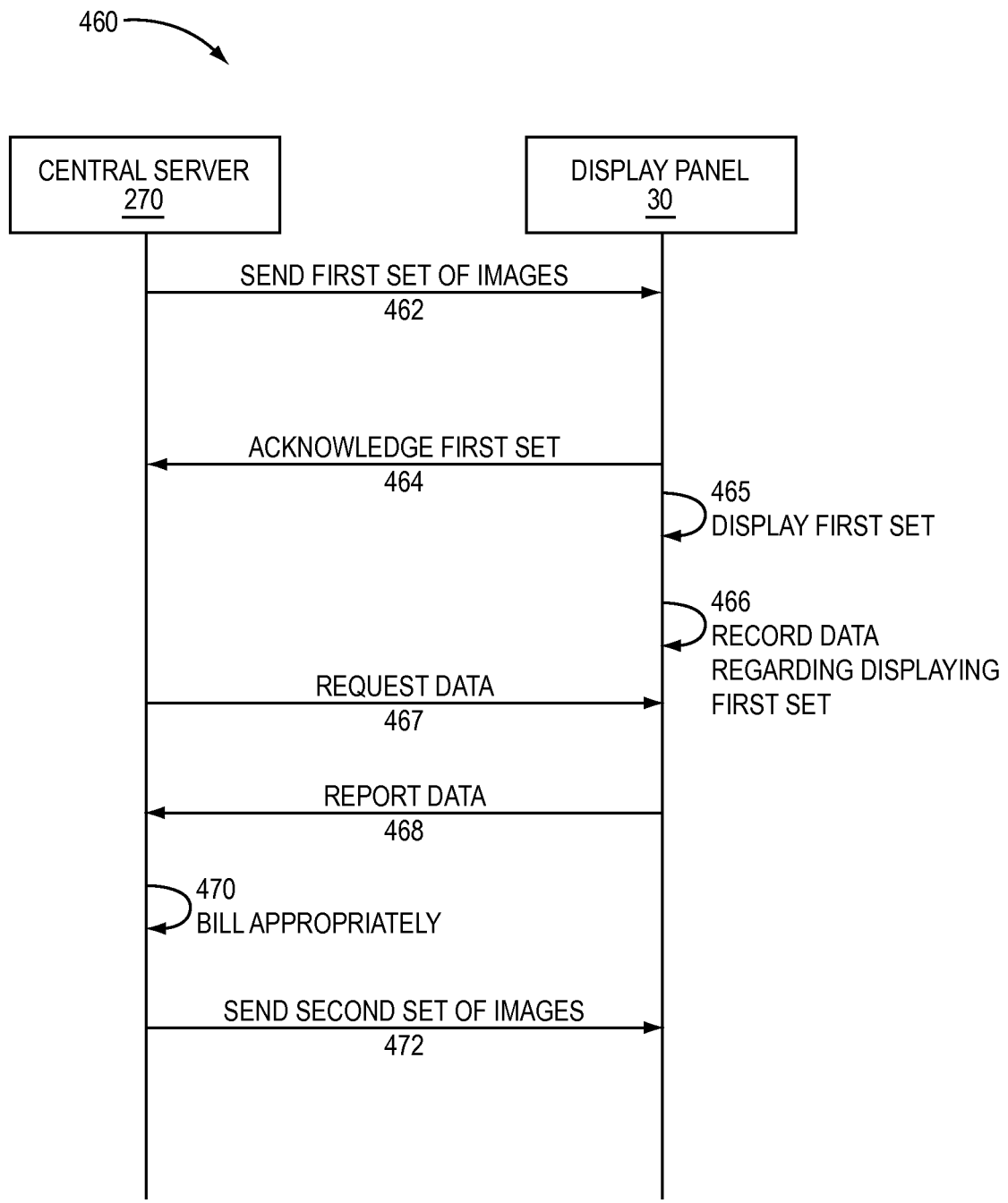

FIG. 21 illustrates a relatively simple first set of communications 460 between central server 270 and display panel 30.

Figure 22:
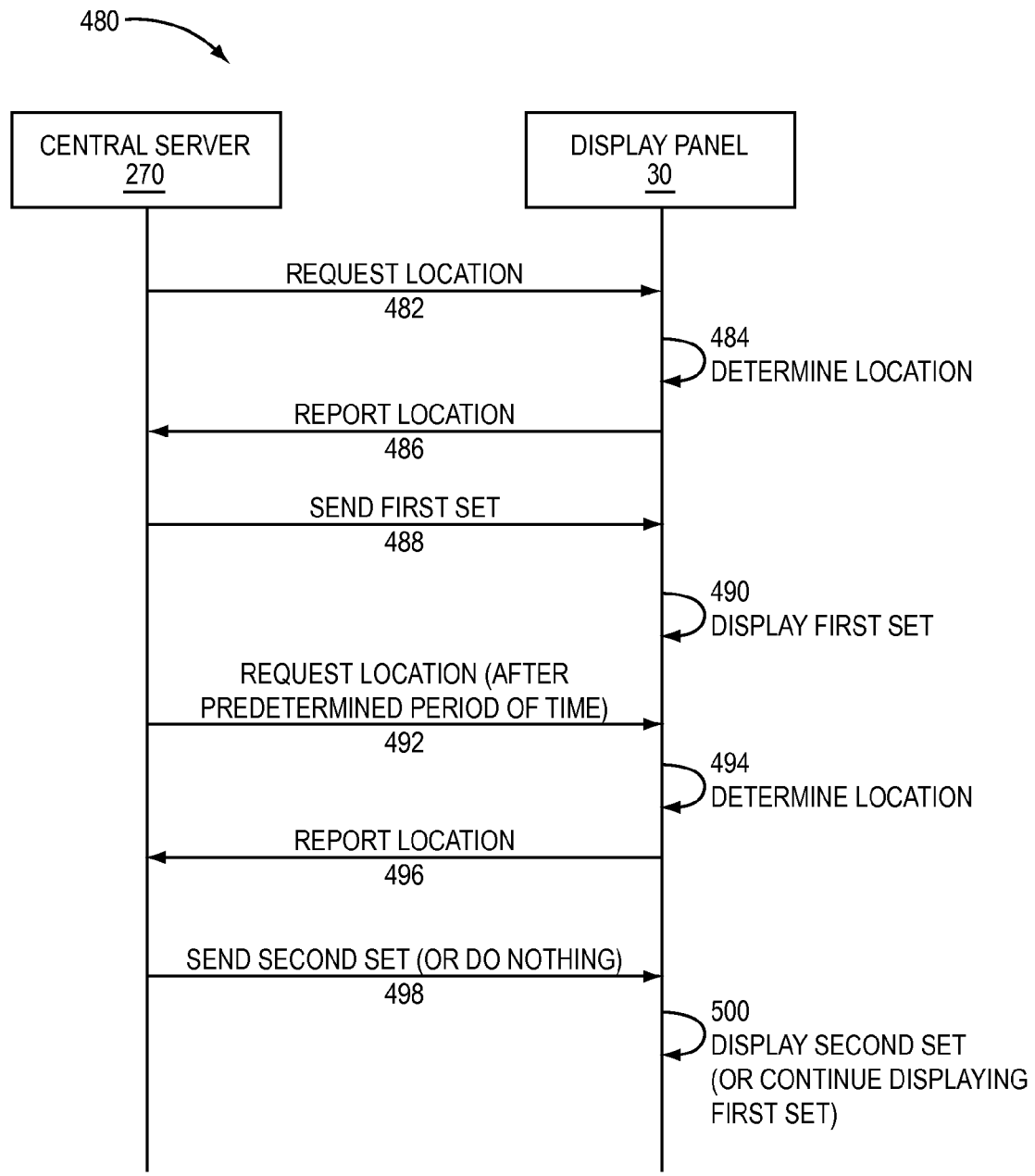

FIG. 22 illustrates a second set of communications 480 between central server 270 and display panel 30 based upon requesting location after a predetermined period of time.

Figure 23:
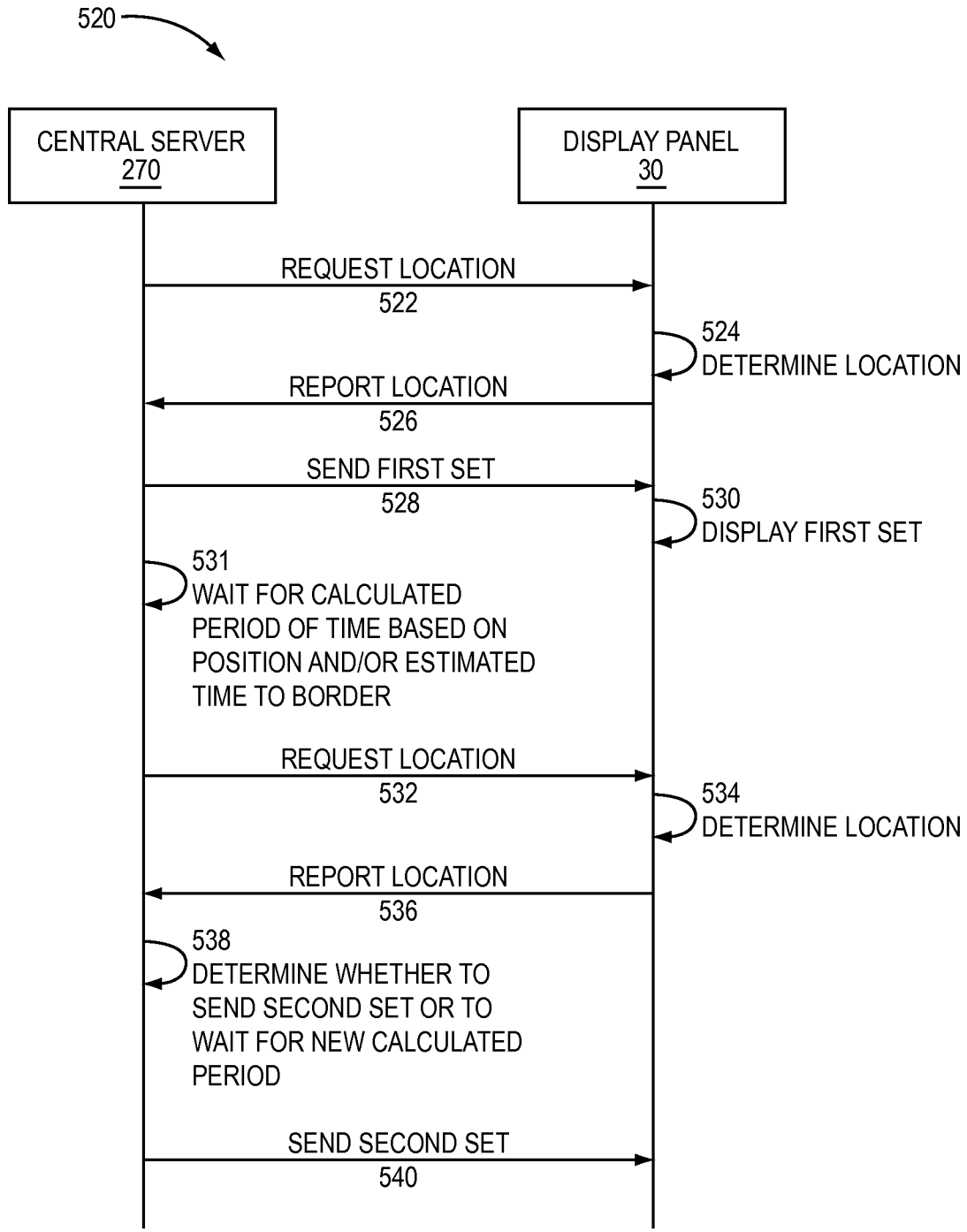

FIG. 23 illustrates a third set of communications 520 based upon predicting when the display panel will cross a boundary into a new zone.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims. The term "car" is used for convenience, but refers to any vehicle with a rear windshield.

Figure 1:
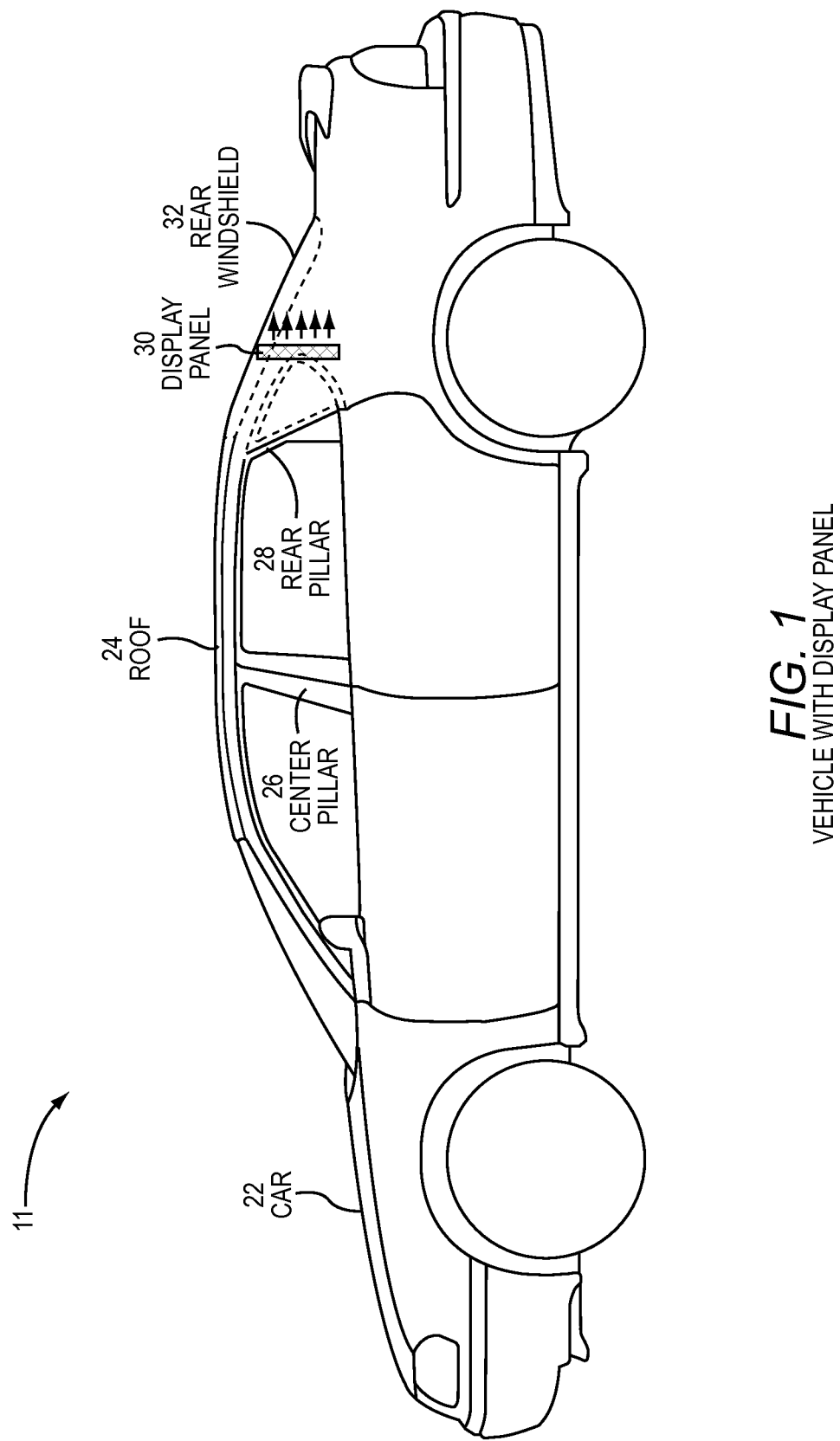
FIG. 1 illustrates a display panel located in a car and illuminating out through the rear windshield.

FIG. 1 illustrates a side view 11, including a display panel located in a car and illuminating out through the rear windshield. Specifically, display panel 30 is located in car 22 and illuminates out through rear windshield 32, as shown by the horizontal arrows pointing rearward. Car 22 includes roof 24 supported by center pillar 26 and by rear pillar 28.

Figure 2:
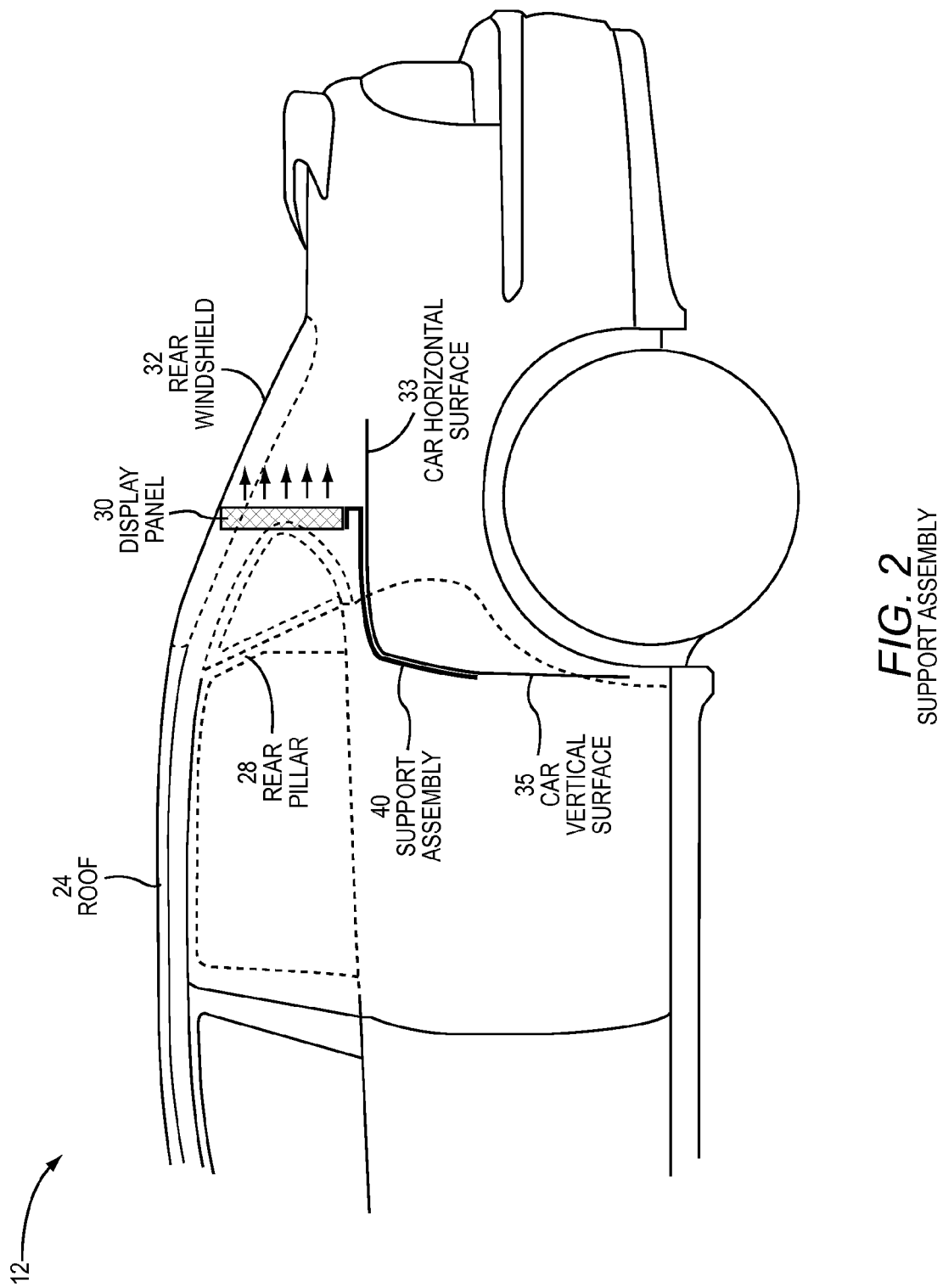
FIG. 2 illustrates a side view of a car, including a support assembly supporting a display panel on a car horizontal surface.

FIG. 2 illustrates a support assembly supporting a display panel on a car horizontal surface. Specifically, support assembly 40 supports display panel 30 on top of car horizontal surface 33 such that illumination passes through rear windshield 32.

The top of display panel 30 fits into a notch located near the junction where rear windshield 32 meets roof 24. Rear pillar 28 supports roof 24. Support assembly 40 lays on car horizontal surface 33, and then bends downward along car vertical surface 35. Car vertical surface 35 is an interior portion of the vehicle, where car seats (not shown) would lean back against. Car vertical surface 35 may be supported by cross beam 99 shown in FIG. 8.

Laying on car horizontal surface 33 helps support assembly 40 to distribute the weight of the display panel 30 along a large area of car horizontal surface 33. Car horizontal surface 33 is an interior portion of the vehicle, where for example, an auxiliary rear window defroster would be laid.

Figure 3:
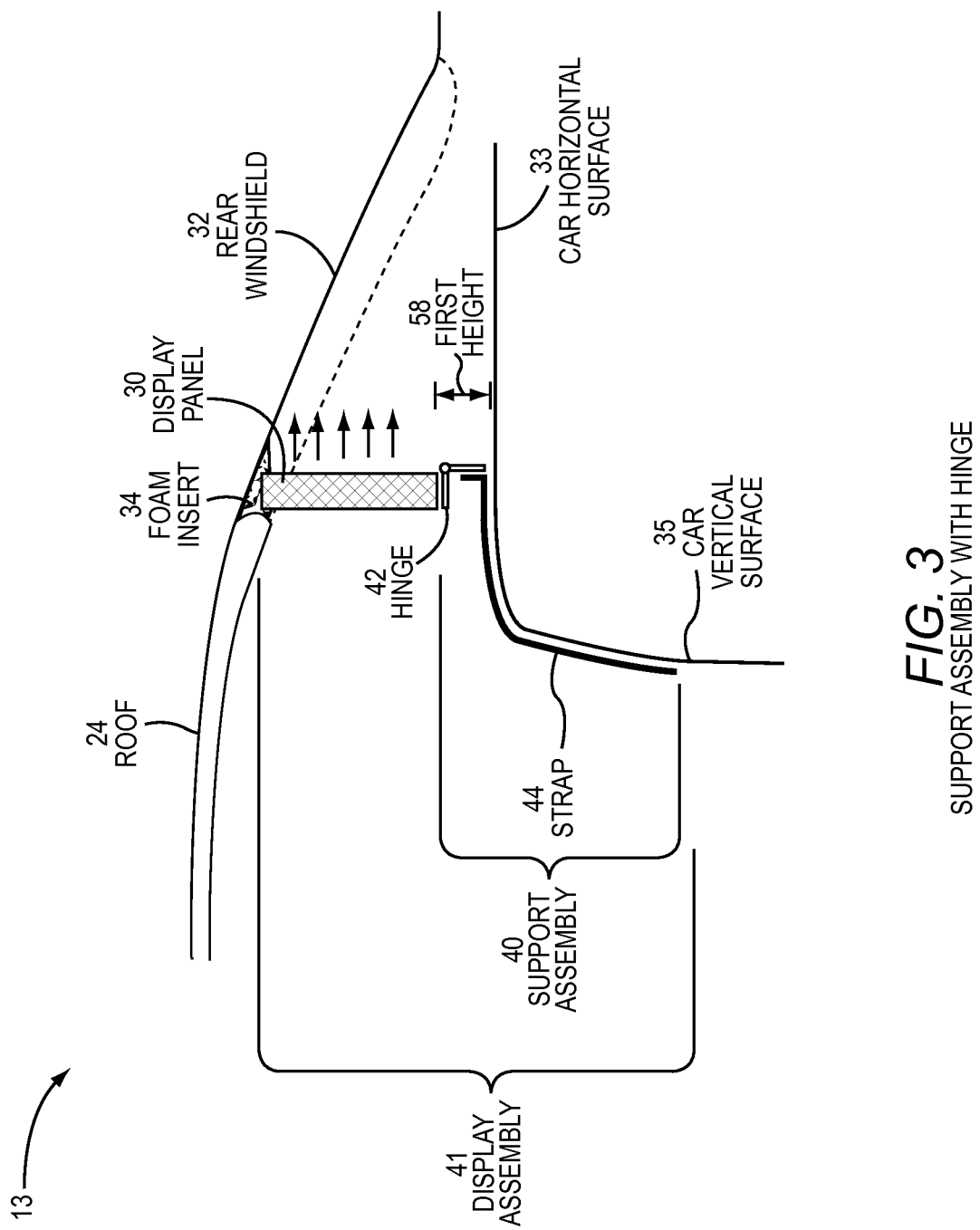
FIG. 3 illustrates a detailed side view of a car including a display assembly.

FIG. 3 illustrates a detailed side view 13 including display assembly 41. Specifically, display assembly 41 includes display panel 30 and support assembly 40. Display panel 30 presses against foam insert 34 into a notch near the junction of roof 24 and rear windshield 32. See FIG. 9 for exemplary roof beam notch 83.

Support assembly includes hinge 42 and strap 44. Strap 44 is bent such that display panel 30 is raised to first height 58. First height 58 is designed to squeeze foam insert 34.

Figure 4:
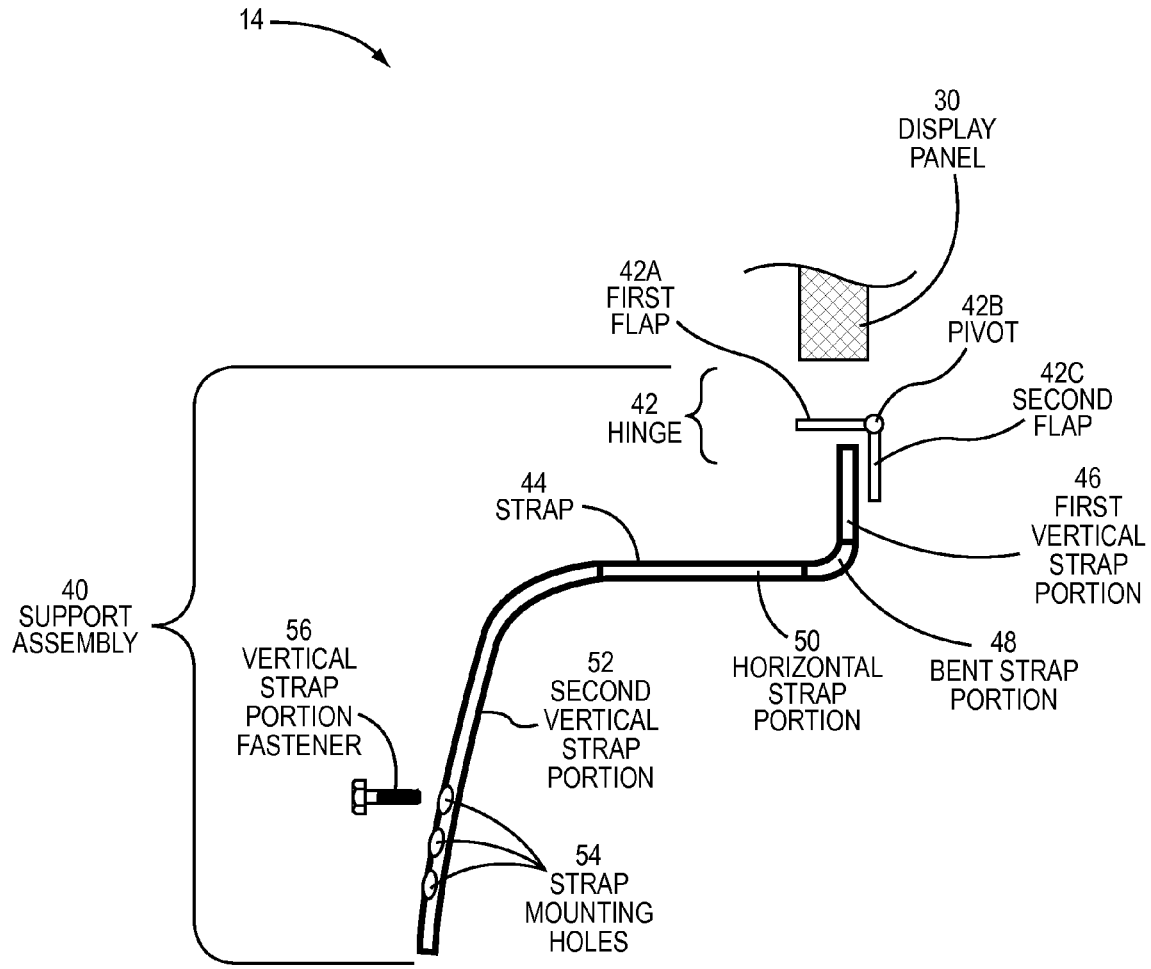
FIG. 4 illustrates strap portions and hinge flaps.

FIG. 4 illustrates portions of strap 44 and illustrates flaps of hinge 42. Specifically, hinge 42 includes: first flap 42A for attachment to display panel 30; pivot 42B; and second flap 42C for attachment to strap 44.

Strap 44 includes (from top to bottom): first vertical strap portion 46; bent strap portion 48; horizontal strap portion 50; and second vertical strap portion 52.

First vertical strap portion 46 may fastened to second flap 42C by many ways such as: welding; rivets; screws; a single mechanical fastener; glue, etc.

Bent strap portion 48 is located to provide a desired first height 58. This bent portion also provides some shock absorption for display panel 30.

Horizontal strap portion 50 extends along car horizontal surface 33, distributing the weight of display panel 30. Horizontal portion 50 must be sufficiently stiff to prevent display panel 30 from moving forward during a crash. For example, a strap with 316 grade stainless steel, 16 gauge thickness, 12 inches long, and 2 inches wide works well.

Second vertical strap portion 52 may be manually bent downwards along car vertical surface 35 (behind the car rear seats, not shown). Second vertical strap portion 52 may include predrilled strap mounting holes 54. As shown below, user may insert one or more vertical strap portion fasteners 56 (such as self-tapping screws) into one or more of the strap mounting holes 54, into car vertical surface 35, and into a cross beam 99 (shown in FIG. 8 below).

In one embodiment, strap 44 has the following dimensions: a length between 8 inches and 16 inches, inclusively; a width between half of an inch and 4 inches, inclusively; and a thickness between 14 gauge and 20 gauge, inclusively.

Alternatively, strap 44 may have different widths in different portions, although that may complicate manufacture. Uniform width is easier to manufacture.

First flap 42A of hinge 42 is fastened to display panel 30. If a single screw is used for this fastening, then support assembly 40 may be easily rotated about the axis of this screw, such that strap 44 may be positioned as desired along car vertical surface 35 so as to fasten to a car cross beam at a convenient location.

Display panel 30 and first flap 42A together (after fastening) rotate about pivot 42B, as discussed below. Thus, there may be two axes of rotation: about the axis of the single screw fastening first flap 42A, and about the axis of pivot 42B.

Figure 5:
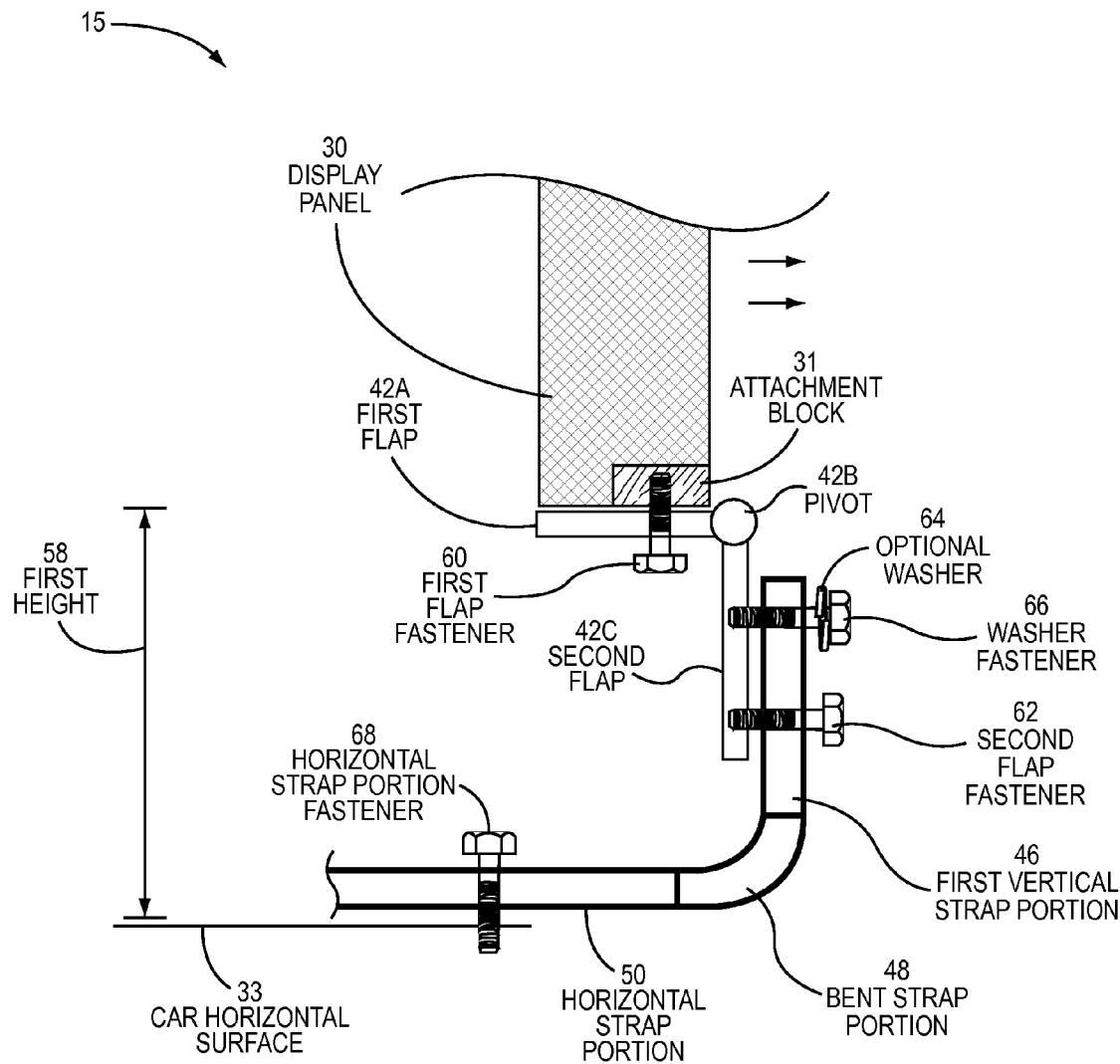
FIG. 5 illustrates hinge fastener details.

FIG. 5 illustrates hinge fastener details. Specifically, in FIG. 5 display panel 30 includes attachment block 31 (see FIG. 8 for additional details). First flap fastener 60 fastens first flap 42A to attachment block 31. As discussed, if a single screw is used, then first flap 42A may rotate about first flap fastener 60. In this case, first flap fastener 60 may be called a "pivot screw" or "pivot axis."

Two or more attachment blocks 31 may respectively attached to two or more hinges 42 (not shown). If two attachment blocks are used, they may be spaced nominally 20 inches apart.

First vertical strap portion 46 may be fastened to second flap 42C using one or more second flap fasteners 62 (e.g., two rivets). Optional washer 64 may be used with optional washer fastener 66.

If second flap 42C is located forward of first vertical strap portion 46 (as shown), then the top edge of first vertical strap portion 46 may extend upwards slightly above (not shown) pivot 42B.

If first vertical strap portion 46 is located forward of second flap 42C (not shown in this figure, but shown in FIG. 4), then the top edge of first vertical strap portion 46 should be below the bottom of pivot 42B such that first flap 42A may rotate partially downwards (see FIG. 6).

Horizontal strap portion 50 may be fastened by horizontal strap portion fastener 68 into car horizontal surface 33. However, generally these horizontal strap fasteners should be avoided because they damage a visible surface of the car, and because the car horizontal surface 33 generally lacks strong structure.

Figure 6B:
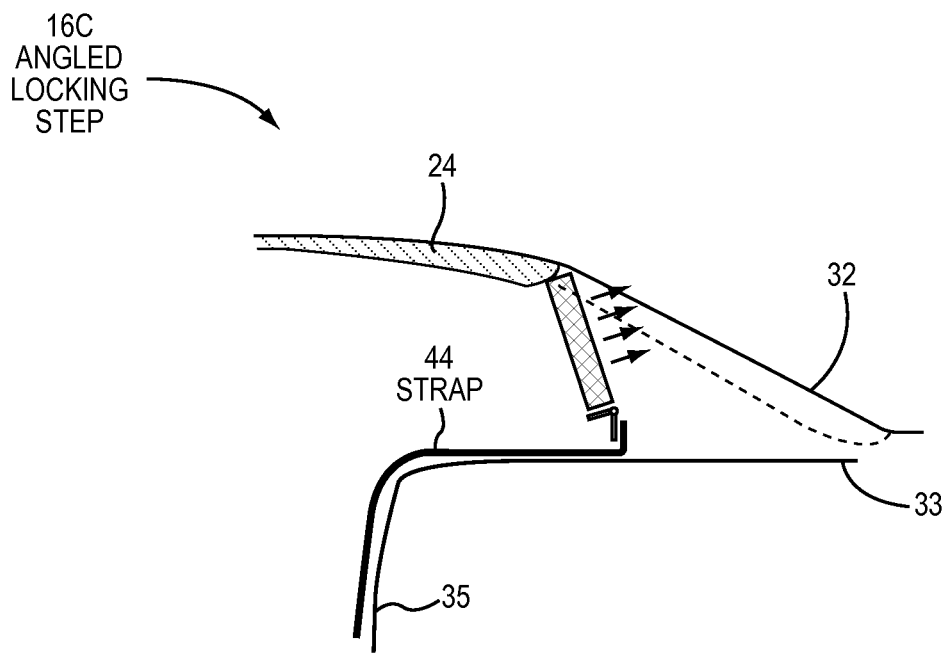

FIGS. 6A and 6B illustrate a mounting procedure, including steps 16A, 16B and 16C. In insertion step 16A, display panel 30 is tilted to the left as shown, then strap 44 and display panel 30 are inserted back along insertion direction 74 such that display panel 30 passes below lip 25 of roof 24.

Figure 9:
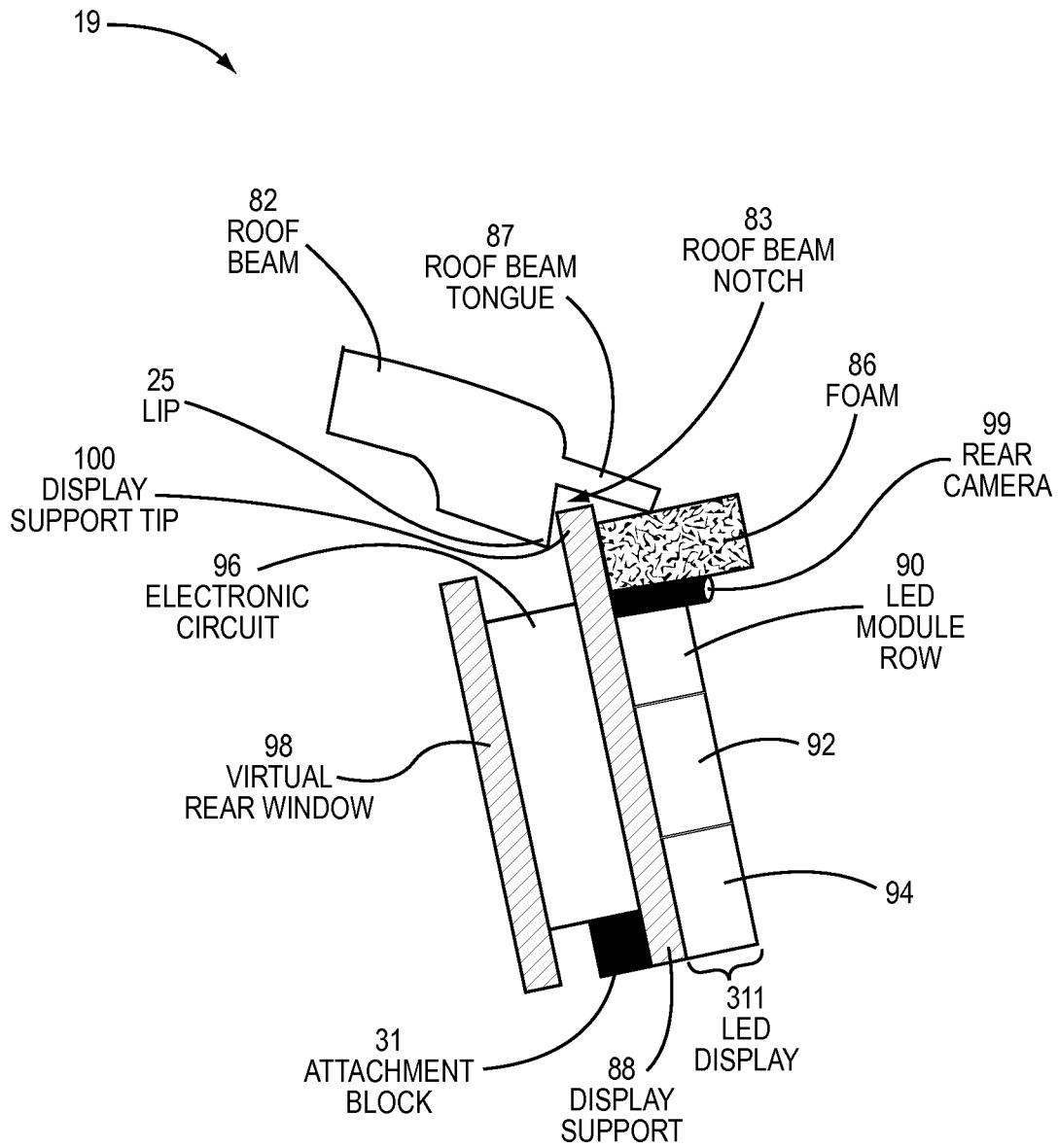
FIG. 9 illustrate roof beam details.

In vertical locking step 16B, strap 44 is pulled forward along locking direction 76 while display panel 30 is simultaneously tilted upward until the top of display panel 30 is wedged into a notch located near the junction of roof 24 and windshield 32, as previously discussed. FIG. 9 provides details of this notch (roof beam notch 83). First height 58 plus display height 70 exceeds lip height 72, such that to top of display panel 30 cannot fall forward, even in a car crash (because it is blocked by lip 25).

Thus, tilting (or rotation) about pivot 42B is essential for properly inserting display panel 30 and then locking display panel 30 into a stable position (blocked by lip 25). Without this procedure (and support assembly 40), it would be extremely difficult to maneuver and then hold display panel 30 in this position. As previously discussed, second flap 42C may be on either side of strap 44.

After display panel 30 is locked into position, then second vertical strap portion 52 (the left portion of strap 44) may be bent downwards along bending direction 78 to become adjacent to vertical car surface 35, as shown by the dashed lines.

In step 16C, display panel 30 is locked into a stable but slightly angled position as shown. Even though display panel 30 is not vertical, LEDs in the display panel have a relatively wide dispersion, such that a person in a car following display panel 30 will still be able to read the display.

FIG. 7 illustrates custom windshields 71 and 76. First embodiment 17A illustrates first custom windshield 71 including horizontal windshield portion 72, vertical windshield portion 74, and bumps 73. In many cars, the slope of rear windshield 32 (dashed lines) prevents display panel 30 from being positioned vertically, and/or prevents display panel 30 from being positioned adequately far enough to the rear. If display panel 30 is strongly angled to the left, then a person in a following car sees a smaller effective area, and the effective intensity of the LEDs in display panel 30 is reduced. Further, a relatively forward location of display panel 30 may interfere with the comfort of passengers (not shown), especially tall passengers.

Thus, custom windshield 71 has a relatively horizontal windshield portion 72 that allows display panel 30 to be positioned relatively far back along car horizontal surface 33. First custom windshield 71 may include bumps 73 holding the top of display panel 30 in position. These bumps 73 may form a channel to receive the top of display panel 30.

Second embodiment 17B illustrates second custom windshield 76 including a relatively large hump 78 configured to receive display panel 30 having a very large display height. In this case, hinge 42 may be attached to strap 44 as shown, such that display panel 30 may be more easily rotated to the rear during insertion (although first embodiment 17A also works).

Second embodiment 17B is preferable if an object such as a center brake light 80 interferes with positioning using first embodiment 17A. Further, If a custom windshield is constructed, then display panel 30 may be firmly mounted to lugs incorporated in the body of the custom windshield to create an integrated unit. The integrated unit may then be installed after the old rear windshield was removed.

Figure 8:
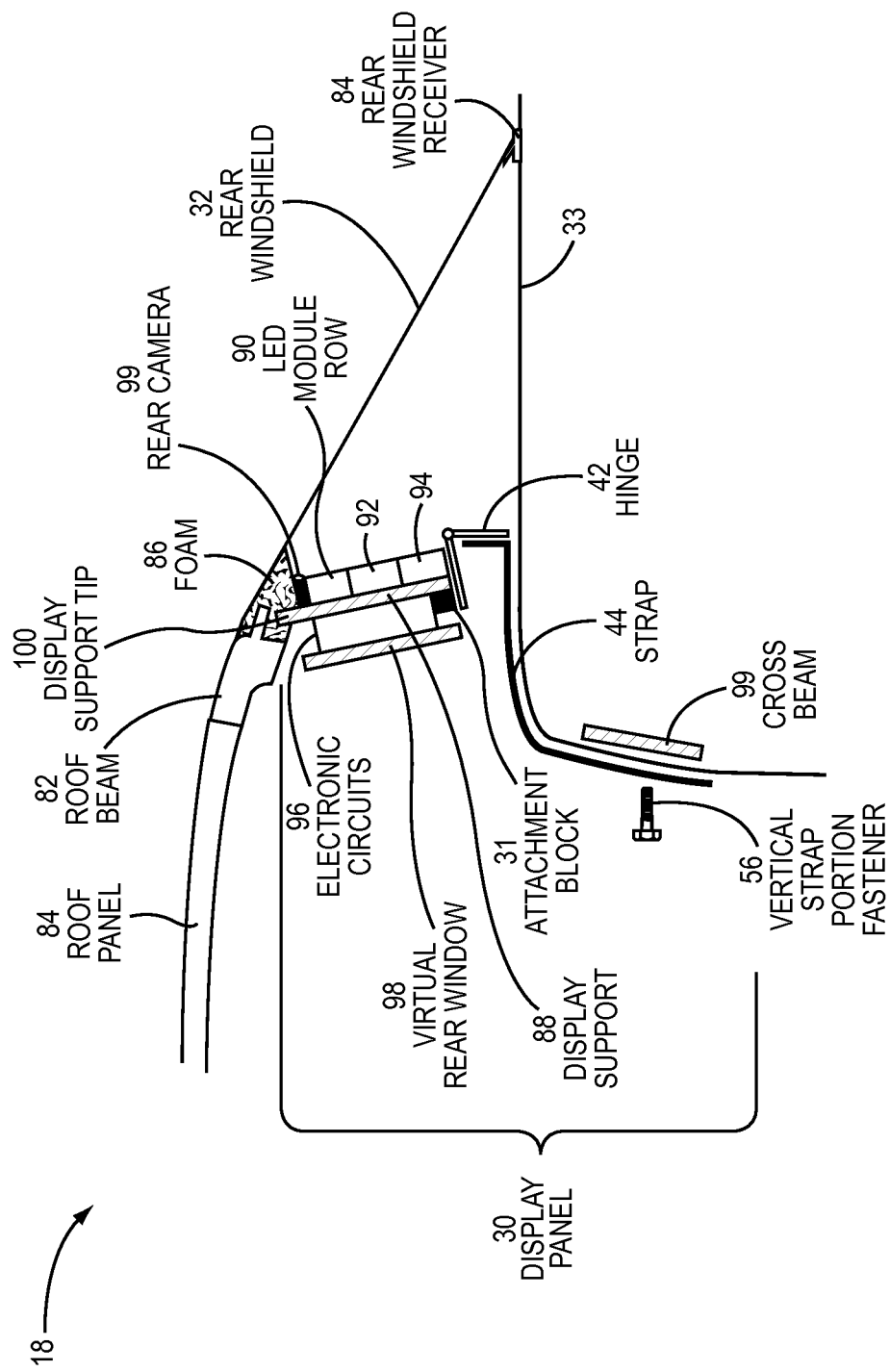
FIG. 8 illustrates display panel details.

FIG. 8 illustrates display panel 30 details including virtual rear window 98, electronic circuits 96, attachment block 31, display support 88, foam 86, camera 99, LED module row 90, LED module row 92, and LED module row 94.

Roof 24 includes roof panel 84 and roof beam 82. Foam 86 helps display support 88 fit snugly into roof beam 82. Vertical strap portion fastener 56 fastens strap 44 into cross beam 99. Cross beam 99 is a horizontal structural member of car 22. Rear windshield 32 fits into roof beam 82 and into rear windshield receiver 84.

Attachment block 31 may be an aluminum block, and may be attached to display support 88 using two screws (not shown). Display support 88 may be a metal panel such as 0.10 inch to 0.125 inch thick aluminum, cut from a 12 inch by 40 inch blank. As previously discussed, two attachment blocks may be used, and may be spaced 20 inches apart.

LED module row 90 may be a row of five commercial LED modules (or units, or groups, or clusters) having dimensions of 8 inches by 4 inches, each LED module including an array of LED pixels of 32 by 16. If display panel 30 includes three rows of 5 LED modules each, then the total array of LED pixels is 160 by 48 (or 7,680 pixels). These cells fit into display support 88 cut from a 12 inch by 40 inch blank. Each pixel contains 3 or 4 LEDs to create a range of colors for each pixel. Pixels with 3 LEDs use red, green, and blue LEDs. Pixels with 4 LEDs generally use red, green, first blue, and second blue LEDs.

If each row contains 6 LED modules, then the total array of LED pixels is 192 by 48 (or 9,216 pixels), and a 12 inch by 48 inch blank is needed to create display support 88.

Display support 88 serves many functions, in addition to being a support for: LED module rows 90, 92, 94; attachment block 31, and electronic circuits 96. Display support 88 locks into roof beam 82 as shown, and as below shown in FIG. 9. Display support 88 has many cut outs (not shown) for wires to pass internally from electronic circuits 96 to LED modules 90, 92, and 94. Cooling air may also pass through these cut outs. Some of the devices in electronic circuits 96 may be mounted on stand-off studs, to allow air to flow between the devices and display support 88. Display support 88 may serve as a ground. The relatively thick structure of display support 88 helps it to serve as a good heat sink, and to minimize hot spots.

Virtual rear window 98 may display an image corresponding to a rearward view out of the rear windshield. Ideally, a passenger would not even be aware that display panel 30 was actually blocking his view out of rear windshield 32. Virtual rear window 98 may alternatively be used for entertainment purposes, such as playing music videos, especially if the car is a limousine with side facing and/or rear facing seats.

Rear camera 99 points rearward, and monitors the view out of the rear windshield. This view may be displayed in virtual rear window 98, and/or in a car navigation device, and/or in a rearview mirror, and/or in a smartphone, and/or in any other display system. Rear camera 99 may be located in another location, such as near a rear license plate. Alternatively, multiple rear cameras may be used, and different cameras may be selected at different times.

FIG. 9 illustrates roof beam 82 details. Roof beam 82 includes lip 25 (previously discussed) and roof beam tongue 87. Lip 25 and roof beam tongue 87 form roof beam notch 83. Display support tip 100 is the top portion of display support 88, and fits snugly into roof beam notch 83. If roof beam notch 83 is horizontal along the width of the car, then a rectangular display support 88 fits snugly across the entire width of roof beam notch 83. If roof beam notch 83 is curved along the width of the car (to accommodate an oval rear windshield), then display support 88 may have a curved (not shown) display support tip 100 to fit snugly into the entire width of roof beam notch 83. This curve may be a complex curve. In one embodiment, the corners of display support are rounded (e.g. for a width of 2 inches) to match the curvature of roof been notch 83 along outer portions of the width of the car.

Foam 86 is located on top of LED module row 90, and fits snugly against roof beam tongue 87 to reduce vibration. Foam 86 may also fit snugly against rear windshield 32 (not shown), and may also fit snugly (not shown) between display support tip 100 and roof beam notch 83. Multiple pieces of foam 86 may be used as desired to minimize vibration. Foam 86 may be glued to display support 88 and/or LED module row 90.

Figure 10:
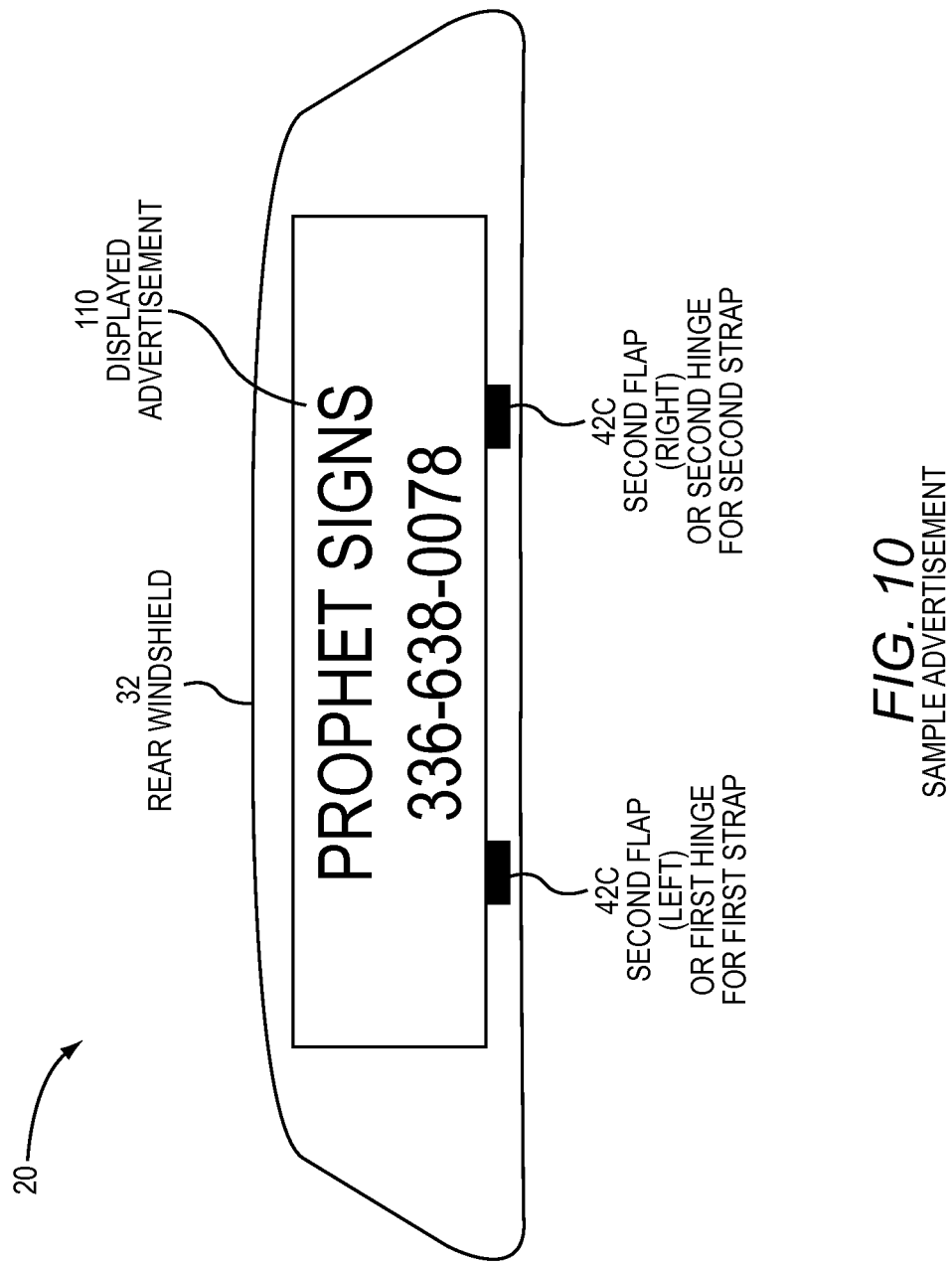
FIG. 10 illustrates a sample advertisement.

FIG. 10 illustrates displayed advertisement 110 as viewed through the rear windshield 32 from a car that is following car 22. Displayed advertisement 110 proudly states, "Prophet Signs 336-638-0078" for the world to see.

Displayed advertisement 110 is displayed in a rearward direction by display panel 30, as previously discussed.

In the embodiment illustrated in FIG. 10, two support assemblies are used (a left and a right). Second flap 42C on the left corresponds to a left support assembly (not shown), and second flap 42C on the right of FIG. 10 corresponds to a right support assembly (not shown).

If three support assemblies are used, then a center support assembly (not shown) may be added. Further, these second flaps 42C may be painted flat black to reduce reflection and to minimize distraction from displayed advertisement 110.

Depending upon the specific car 22 and on the specific display panel 30 used, some pixels may not be visible from the rear of the car (for example, the top row of pixels and/or the bottom row of pixels, or some corner pixels). In this case, an advertisement may be "re-sized" or fully redesigned to account for some pixels being effectively lost. Further, the effectively lost pixels may be turned off to save power.

Similarly, in some cases the far left column of pixels and/or the far right column of pixels may be effectively lost (not shown). Again, an advertisement may be resized, and/or the effectively lost pixels may be turned off to save power. For example, the advertisement may be resized for an oval shape (not shown) if corner pixels are effectively lost.

Figure 11:
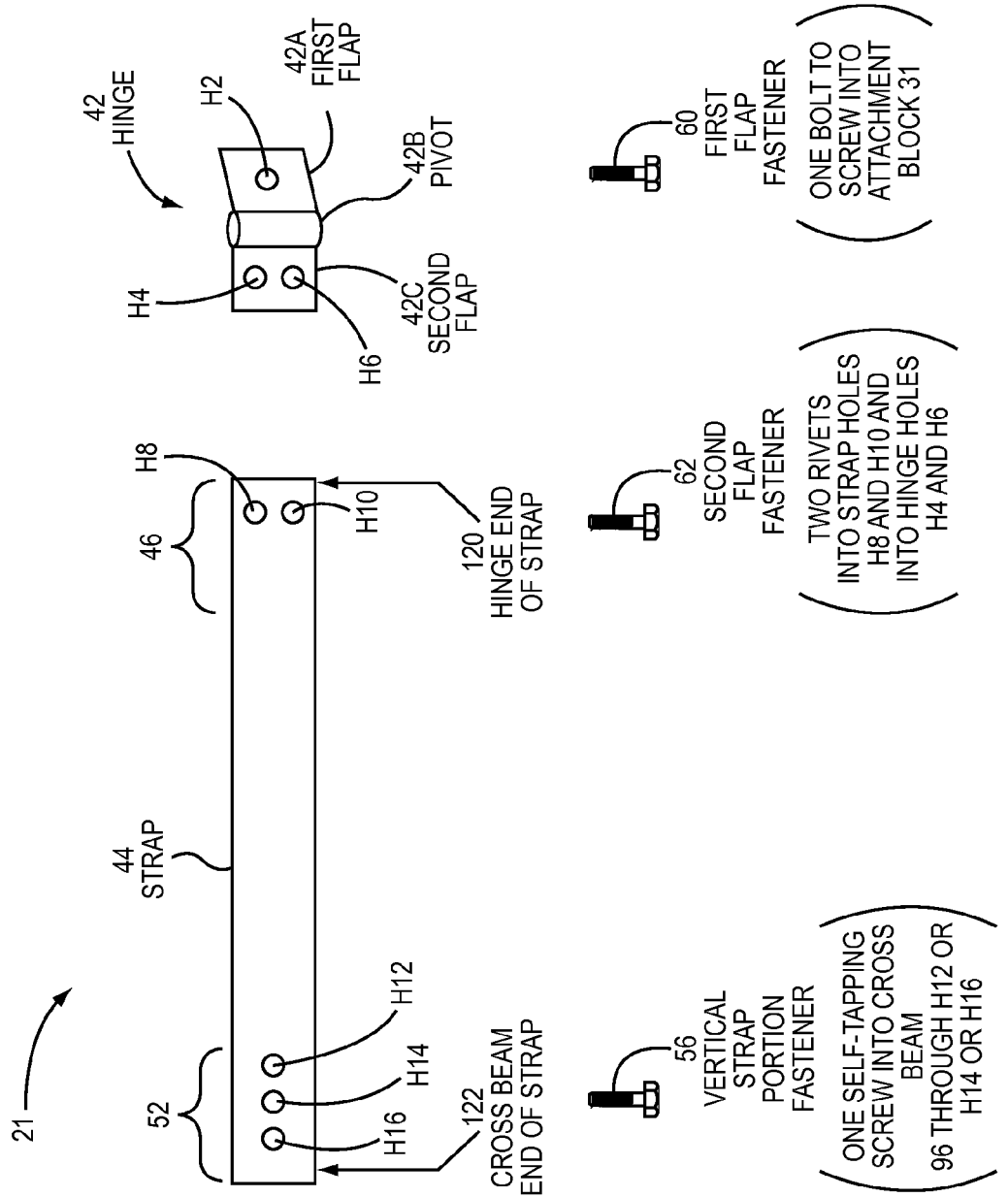
FIG. 11 illustrates strap details.

FIG. 11 illustrates details of strap 44. Strap 44 includes hinge end of strap 120 and cross beam end of strap 122. Two holes H8 and H10 are located in hinge end of strap 120, and three holes H12, H14, and H16 are located in cross beam end of strap 122.

Hole H16 is 0.5 inches from the left edge of strap 44, hole 14 is one inch to the right of hole H16, and hole 12 is one inch to the right of hole H14. Different numbers of holes at different locations are acceptable. For example, two rows of holes may be used, with a first row staggered relative to the second row (not used), providing numerous available holes for mounting.

Vertical strap portion fastener 56 may be one or more self-tapping screws that tap into cross beam 99 (not shown) through one or more of holes H12, H14, and H16.

Hinge 42 includes two holes H4 and H6 in second flap 42A, and one hole H2 in first flap 42A. Second flap fastener 62 fastens second flap 42C to first vertical strap portion 46. Second flap fastener 62 may include a first rivet passing through holes H4 and H8, and a second rivet passing through holes H6 and H10.

First flap 42A may include centrally located hole H2. First flap fastener 60 may be a single screw or bolt passing through hole H2 and into attachment block 31 (not shown). In this fashion, support assembly 40 may rotate about the axis of first flap fastener 60.

In one embodiment, strap 44 is a strip of stainless steel, and has the following dimensions: a length between 8 inches and 16 inches inclusively; a width between half of an inch and 4 inches, inclusively; and a thickness between 14 gauge and 20 gauge, inclusively.

In one embodiment, strap 44 is 316 stainless steel, 12 inches long, 16 gauge thick, 2 inches wide, and has a 90 degree bend 1.6 inches from hinge end of strap 120.

Further, strap 44 may have multiple bends to improve the shock absorption characteristics of support assembly 40, as discussed below in FIG. 12.

Figure 12:
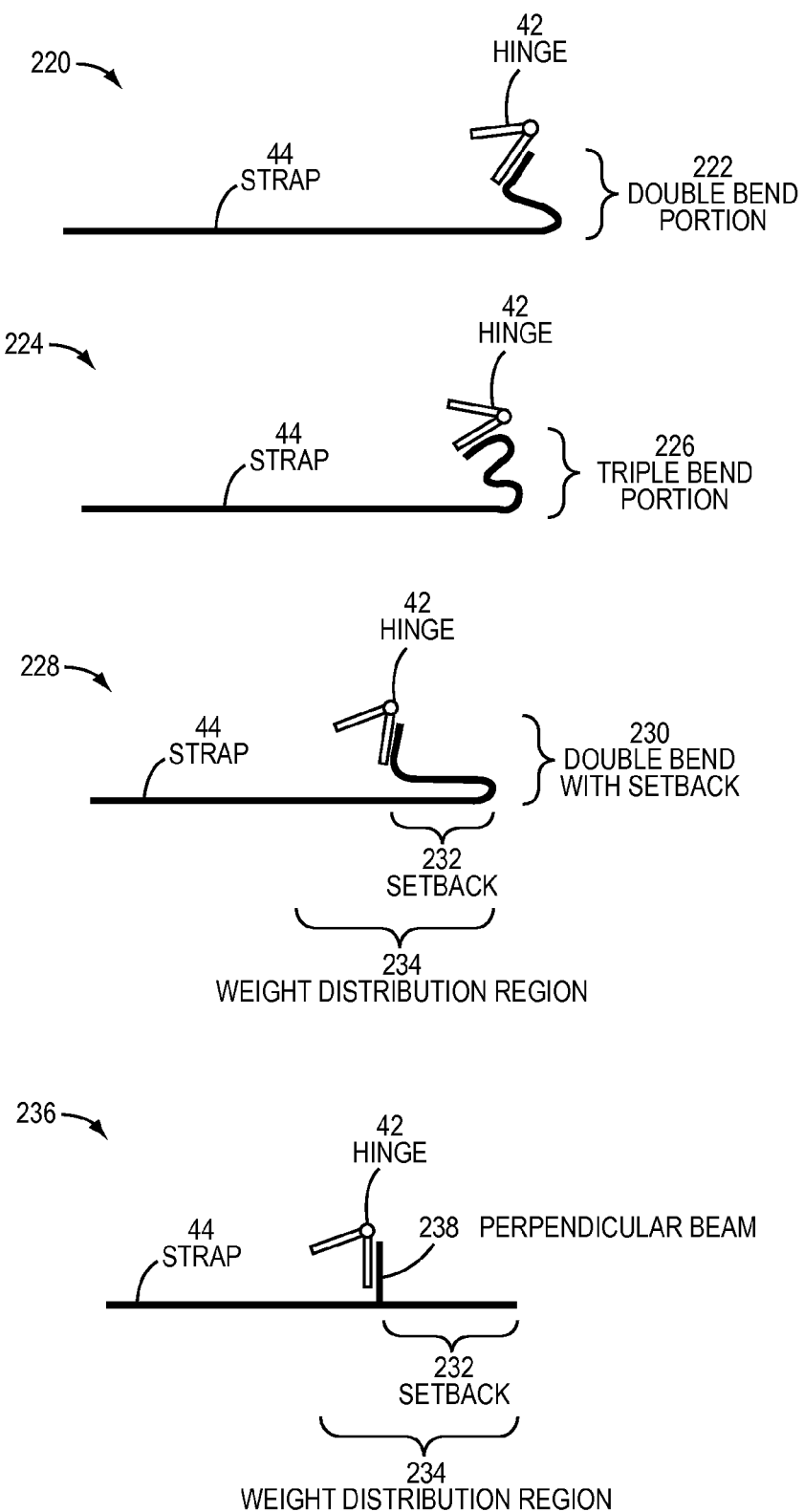
FIG. 12 illustrates straps with multiple bends.

FIG. 12 illustrates straps with multiple bends. Embodiment 220 illustrates double bend portion 222. Embodiment 224 illustrates triple bend portion 226.

Embodiment 228 illustrates double bend with setback 230. Setback 233 brings the hinge towards the front of the car. Weight distribution 234 illustrates that the weight of display panel 30 (not shown) is distributed to the left and to the right of hinge 42, providing a large surface area to spread the weight across car horizontal surface 33. Using very wide straps 44 also helps to distribute the weight. Straps 44 may be very wide in this weight distribution region, and then may be narrow in other regions.

If strap 44 is sufficiently flexible, then embodiments 220, 224, and 228 may omit hinge 42, and the strap may attach directly to display panel 30 such that display panel 30 may tilt (to pass under lip 25 of roof 24) and then un-tilt during installation to catch against lip 25, similar to FIGS. 6A and 6B discussed above.

Embodiment 236 is similar to embodiment 228, but uses a simple perpendicular beam 238 for attachment to hinge 42. This perpendicular beam may be tilted as desired, for example, 45 degrees towards the right.

Figure 13:
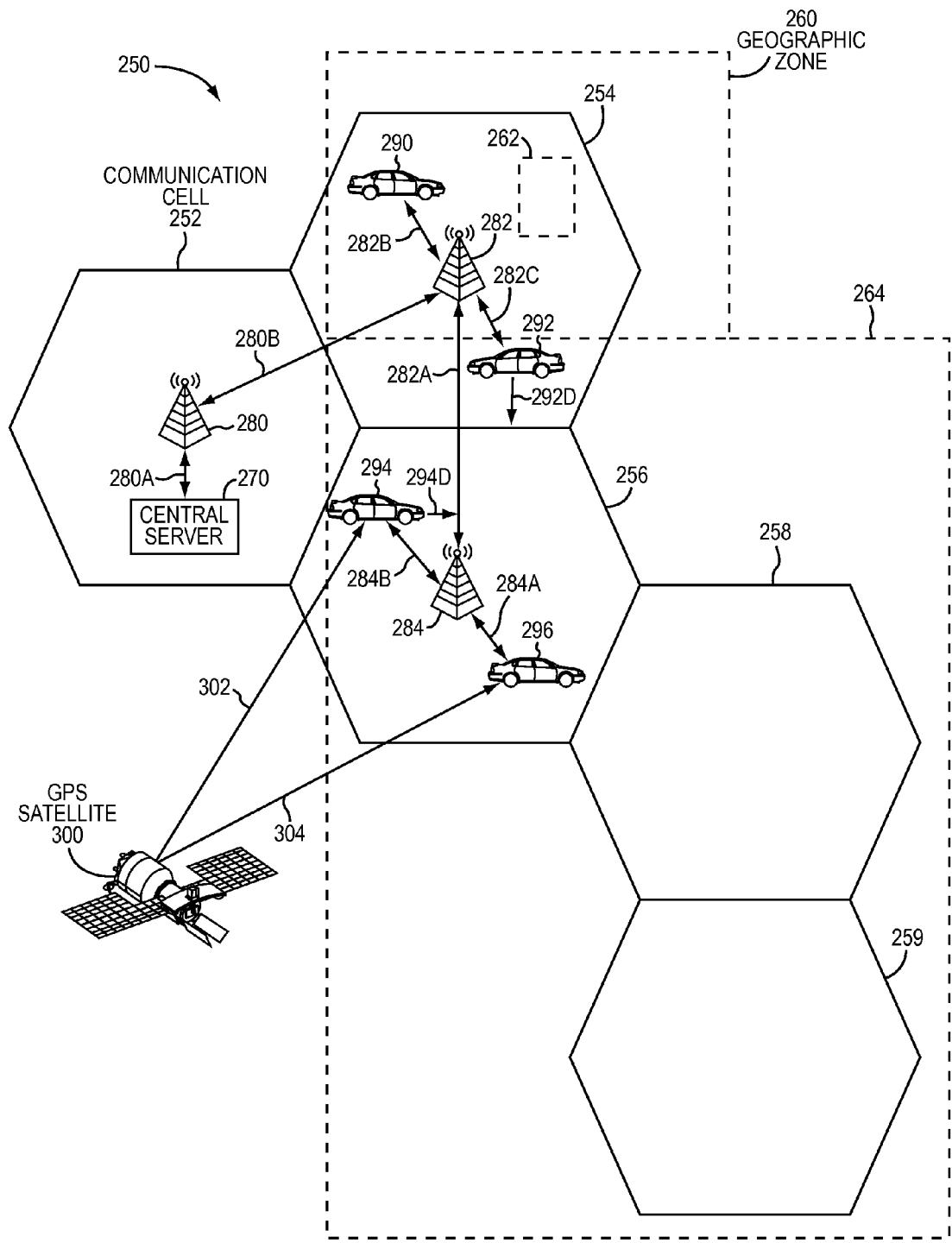
FIG. 13 illustrates a mobile media display system.

FIG. 13 illustrates exemplary mobile media display system 250.

Geographic zones 260, 262, and 264 are defined as is convenient for advertisement. Communication cells 252, 254, 256, 258, and 259 may be defined independently of the geographic zones, or may coincide.

These geographic zones may be large and may include multiple communications cells. For example, geographic zone 264 is large and includes all of communication cells 258 and 259, and includes portions of other communication cells 252, 254, and 256. Alternatively, geographic zone 262 is small and is limited to only a small portion of communication cell 254, and is limited to only a small portion of geographic zone 260. These geographic zones may be redefined by the central server.

Communication cell 252 is serviced by base station 280. Communication cell 254 is serviced by base station 282. Communication cell 256 is serviced by base station 284. Regions near the borders of communication cells may be serviced by multiple base stations (not shown).

Central server 270 communicates with nearby base station 280, and then base station 280 communicates with base station 282. Thus, central server 270 may communicate indirectly with base station 284 (through base station 282). Alternatively, central server 270 may communicate directly with base station 284 (not shown). Central server 270 includes a processor and a non-transitory computer readable storage medium storing instructions that, when executed, cause the processor to perform steps described in later figures.

Vehicles 290 and 292 may communicate with base station 282 while in communication cell 254. Vehicles 294 and 296 may communicate with base station 284 while in communication cell 256.

Specifically, central server 270 communicates with vehicle 290 through path 280A, 280B, and 282B; with vehicle 292 through path 280A, 280B, and 282C; with vehicle 294 through path 280A, 280B, 282A, and 284B; and with vehicle 296 through path 280A, 280B, 282A, and 284A.

Vehicle 292 is traveling in direction 292D towards a border between communication cell 254 and communication cell 256. Vehicle 294 is traveling in direction 294D away from a border between communication cell 252 and 256.

GPS satellite 300 sends positioning signals received by GPS receivers (not shown) in each vehicle. Of course, at least three satellites are necessary to determine a position, but only one satellite is shown in order to reduce clutter. Thus, each vehicle may determine its position as desired, and may report its position to central server 270 through the communication paths described above. In one embodiment, vehicles only determine and report their positions upon receiving a position query. The details of these communications and reports are described below.

Figure 14:
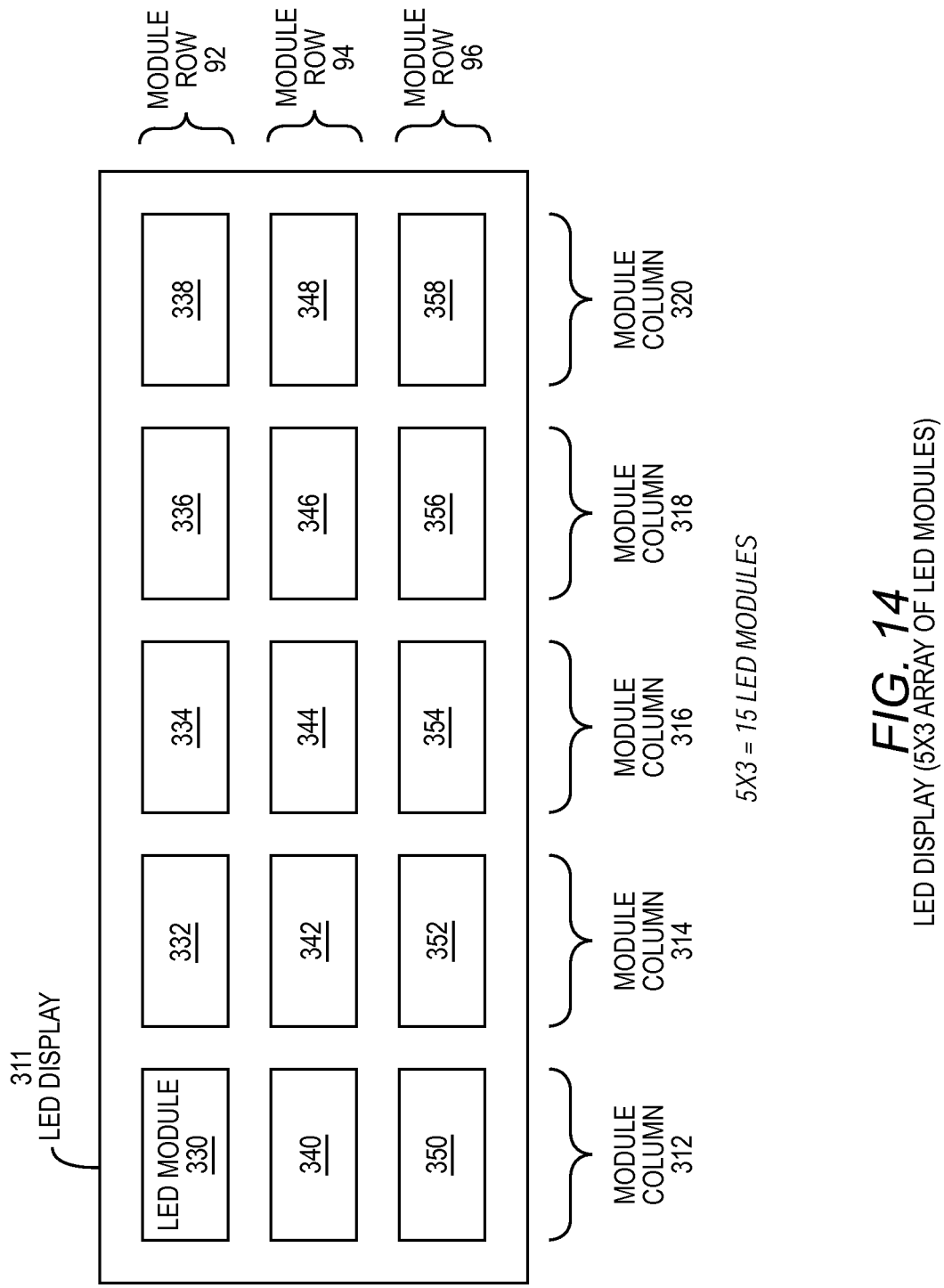
FIG. 14 illustrates an LED display.

FIG. 14 illustrates LED display 311. In one embodiment, LED display 311 includes fifteen LED modules located in an array of five columns by three rows. In another embodiment (not shown), the array may include a sixth column.

Commercial LED pixels are often organized into square or rectangular units called "LED modules" or "LED assemblies" for convenience of mounting and control. Many LED modules may be combined to form an outdoor billboard, or fifteen LED modules may be combined to form an LED display that can fit into the back of a vehicle.

Module row 92 includes LED modules 330, 332, 334, 336, and 338. These LED modules in a single row are typically daisy chained together (not shown) for control.

Module row 94 includes LED modules 340, 342, 344, 346, and 348. Module row 96 includes LED modules 350, 352, 354, 356, and 358.

Alternatively, this array of LED modules may be daisy chained together by module column for convenient control, using module column 312, module column 314, module column 316, module column 318, and module column 320.

Alternatively, LED display 311 may be replaced by any other display system such as LCD (liquid crystal display), OLED (organic light emitting diode), or by projection onto a translucent screen, or by projection onto a reflective screen, or even by a cathode ray tube system. At present, display systems used by televisions and computer monitors lack sufficient illumination to be attractive for advertising through the rear windshield of a vehicle.

Figure 15:
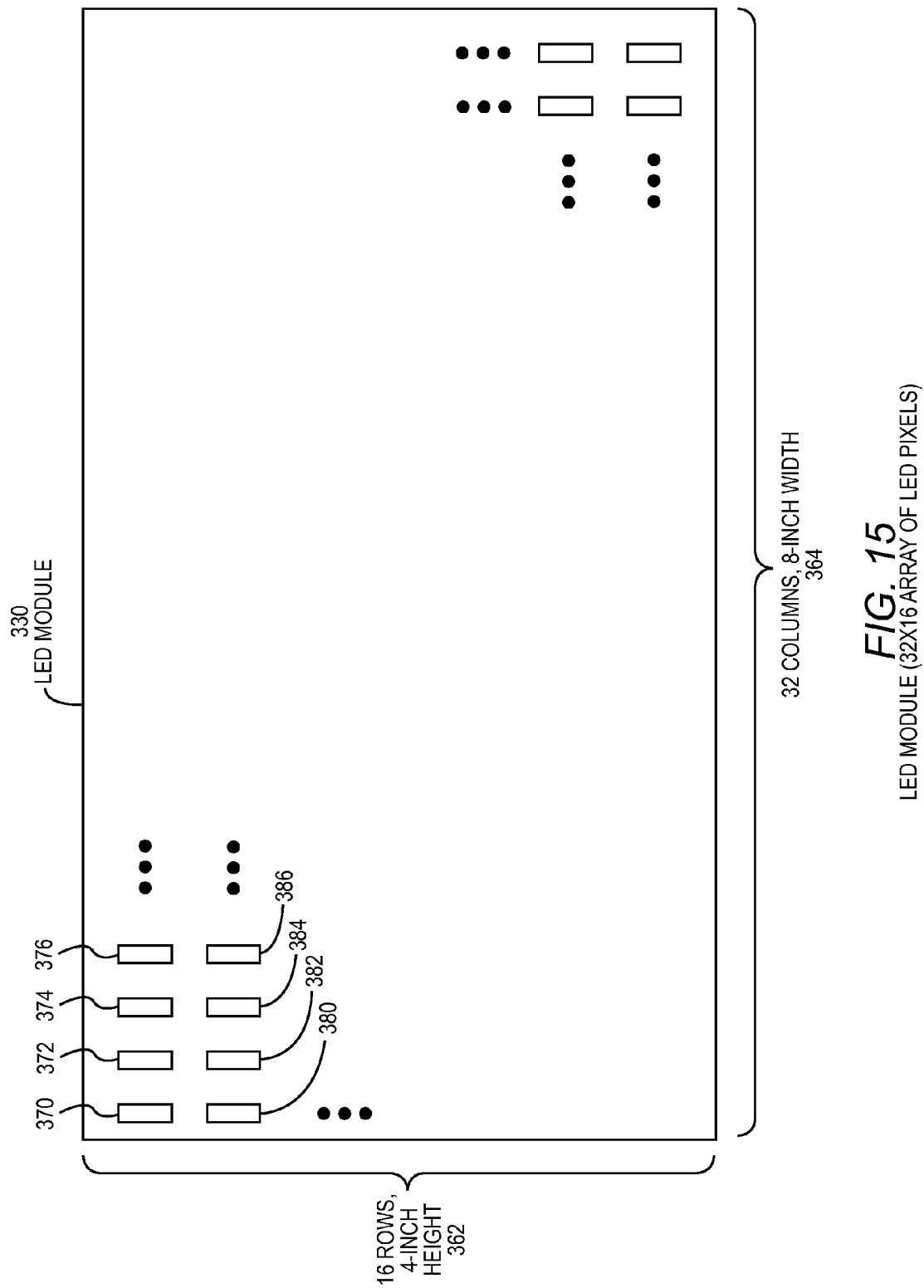
FIG. 15 illustrates an LED module.

FIG. 15 illustrates LED module 330. In one embodiment, LED module 330 includes 512 LED pixels organized in columns 364 and rows 362. Specifically, columns 364 includes 32 columns, and rows 362 includes 16 rows, forming an array of 32×16 LED pixels, or 512 LED pixels.

For example, the top row of LED module 330 includes LED pixels 370, 372, 374, 376, etc., and the second row of LED module 330 includes LED pixels 380, 382, 384, 386, etc. Every single LED pixel may be individually controlled.

LED module 330 is a very convenient building block for an LED display. LED module 330 is 8 inches wide by 4 inches tall. Other LED modules (not shown) are smaller, and are 4 inches wide by 4 inches tall. Thus, a sixth column may be added (not shown) that is formed by these smaller modules, allowing the width of LED display 311 to be increased by merely 4 inches (instead of by the 8 inches that would be required if a sixth column of full sized LED modules was added).

Figure 16:
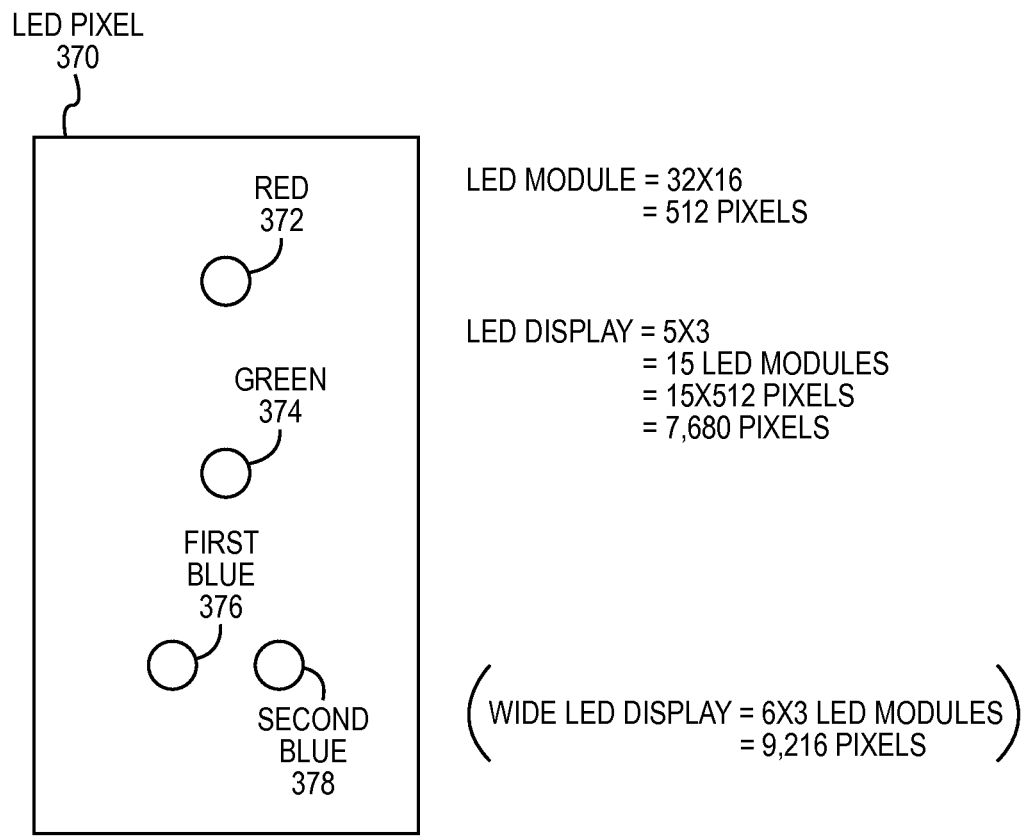
FIG. 16 illustrates an LED pixel.

FIG. 16 illustrates LED pixel 370. A "full color" LED pixel conventionally includes at least three distinct LEDs (subpixels), each having a different color, such as red, green, and blue. These distinct LEDs (forming a single pixel) are often called "subpixels." LED pixels using more than three distinct LEDs are called "MultiPrimary," and may use red, green, blue, and yellow (or red, green blue, yellow, and cyan). Alternatively, OLED pixels may be deposits on a substrate.

In one embodiment (as shown), LED pixel 370 includes four subpixels: red subpixel 372, green subpixel 374, first blue subpixel 376 (deep blue), and second blue subpixel 378 (bright blue). First blue 376 is a different color than second blue 378. Thus, LED module 330 includes 512 pixels. LED display 311 includes 15 LED modules, and includes 7,680 pixels.

Alternatively (not shown), adding a sixth column of similar (large, 4 inch by 8 inch) LED modules yields a display including 9,216 pixels. If the sixth column is made of three smaller modules (4 inch by 4 inch, each having 256 pixels, not shown), then the sixth column adds 768 pixels, totaling 8,448 pixels for the LED display. Thus, in some embodiments the LED displays have 7,680 pixels, or 8,448 pixels, or 9,216 pixels.

Figure 17:
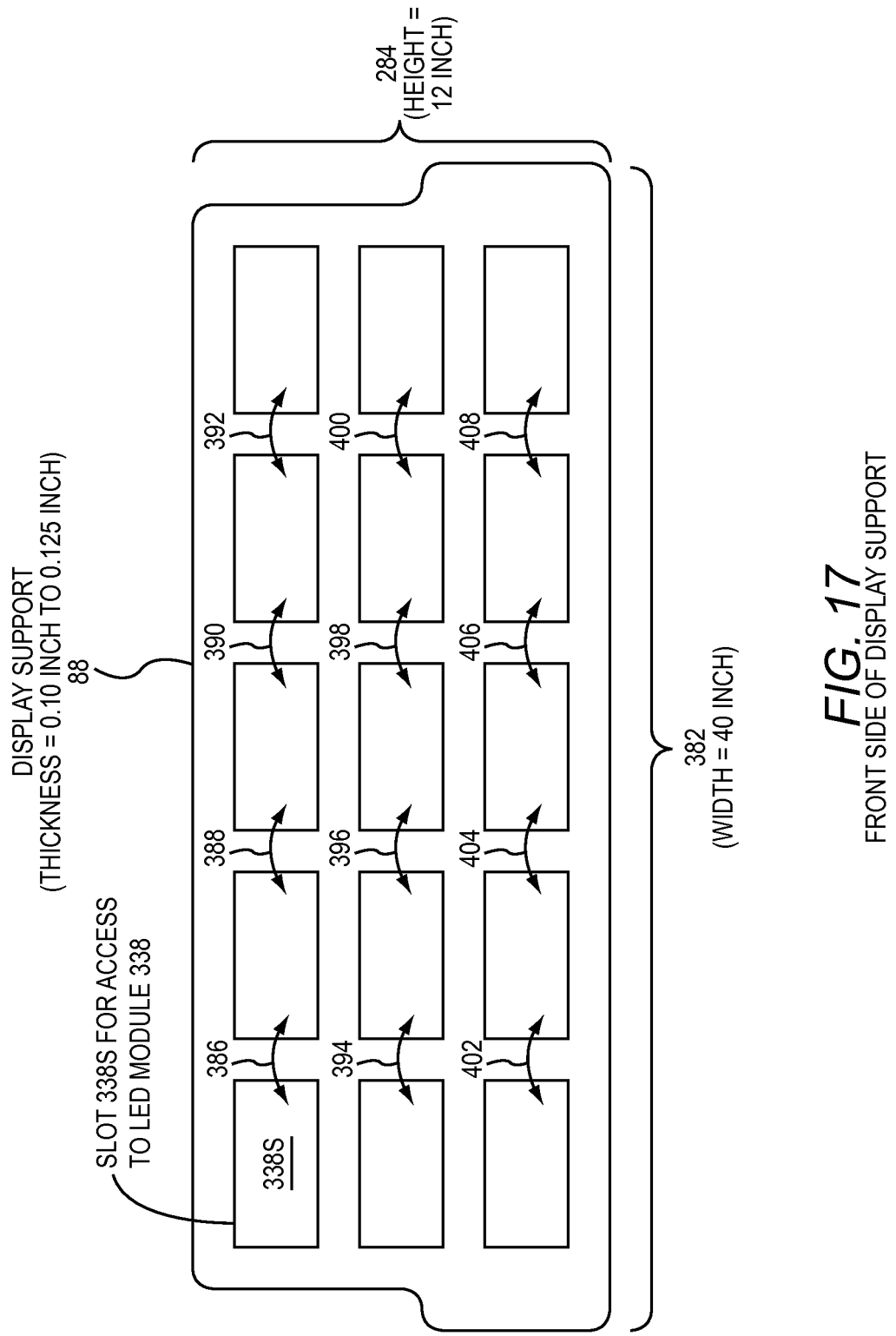
FIG. 17 illustrates display support 88.

FIG. 17 illustrates a front side of display support 88 having a width 382 and a height 384. In one embodiment, display support 88 is cut from a blank of 12 inch height by 40 inch width by 0.100 inch thickness (or 0.125 inch thickness) blank of aluminum. These dimensions are for the array of fifteen LED modules described in FIG. 14. Aluminum is practical because it is light, thermally conductive, easy to cut, and inexpensive. Other materials may be used.

Slot 338S allows access to wiring connectors located on the wiring side (non-illumination side) of LED module 338.

A total of fifteen slots are provided in display support 88 for access to the fifteen LED modules shown in FIG. 14.

Numerous small holes are provided in display support 88 for attaching the LED modules (e.g., six or eight holes per LED module), and for attaching standoff mounts for some of the other electrical components (not shown) that will be positioned on the front side of display support 88.

As discussed in FIG. 14, module row 92 includes LED modules 330, 332, 334, 336, and 338. These LED modules in a single row are typically daisy chained together for control. The location of connectors (not shown) in the LED modules facilitate this type of daisy chaining in a row. In FIG. 17, wiring connectors or busses 386, 388, 390, and 392 daisy chain the LED modules in module row 92 as shown using the corresponding slots. Further, power is provided to each LED module through these slots. For example, a five volt power wire (not shown) and a ground wire (not shown) are provided to LED module 338 through slot 338S. Thus, each LED module is controlled, powered, and partially air cooled through its respective slot.

Figure 18:
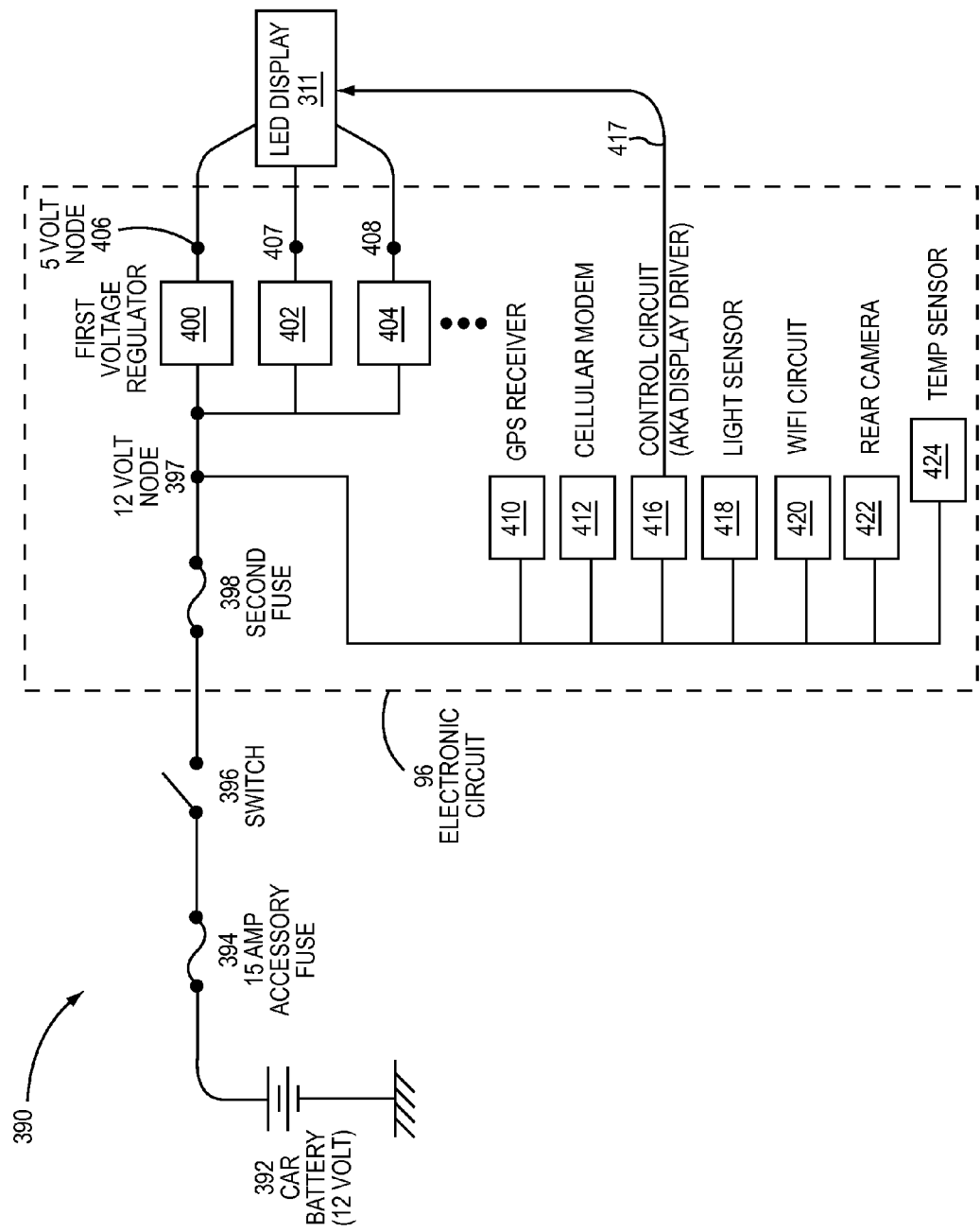
FIG. 18 illustrates a power wiring circuit

FIG. 18 illustrates a power wiring circuit 390. Car battery 392 provides 12 volts to accessory fuse 394 (a 15 amp fuse), then to switch 396, then to 12 volt node 397.

12 volt node 397 serves as a supply for numerous 12 volt powered circuits: first voltage regulator 400; second voltage regulator 402; third voltage regulator 404; GPS (Global Positioning System) receiver 410; cellular modem 412, control circuit 416, light sensor 418; WIFI (wireless local area network based on IEEE 802.11 standards) 420; rear camera 422; temperature sensor 424.

Some of these 12 volt powered circuits may be commercially available circuits designed for cars, such as GPS receiver 410. Alternatively, some of these circuits may be powered by 5 volts generated by first voltage regulator 400. For example, control circuit 416 may be powered by 5 volts (not shown). Further, control circuit 416 communicates with LED display 311 through control lines 417.

In this embodiment first voltage regulator 400 outputs 5 volts to 5 volt node 406, second voltage regulator 402 outputs 5 volts to 5 volt node 407, and third voltage regulator 404 outputs 5 volts to 5 volt node 408.

Additional fuses may be used, for example between 12 volt node 397 and the numerous 12 volt powered circuits.

Figure 19:
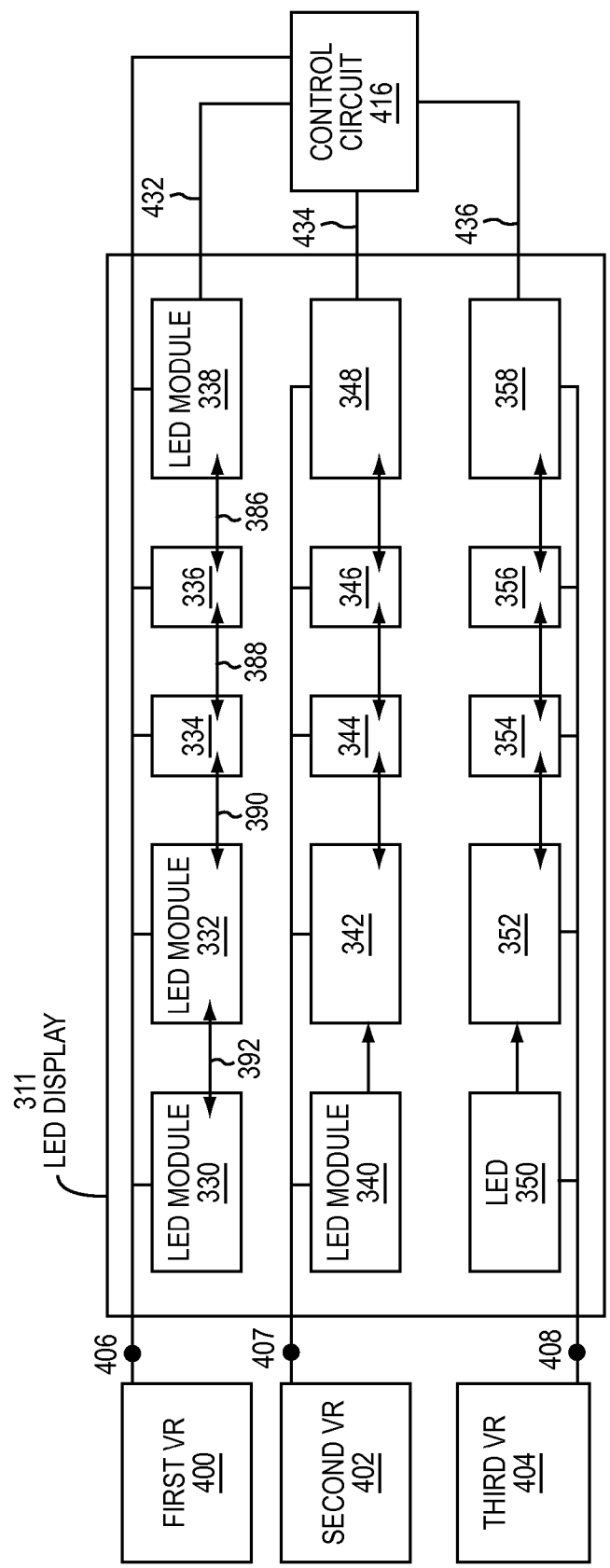
FIG. 19 illustrates LED display power distribution.

FIG. 19 illustrates LED display 311 power distribution. In one embodiment, three VRs (voltage regulators) rated at 20 amps of 5 volt output (100 watts) each are used. For a 5×3 array of LED modules, first voltage regulator 400 powers the first row of LED modules (330, 332, 334, 336, and 338) and powers control circuit 416, second voltage regulator 402 powers the second row of LED modules, and third voltage regulator 404 powers the third row of LED modules. This is a symmetric regulation (each VR rated at 20 amps) and a balanced distribution (each LED module receiving ⅕ of a 20 amp VR, momentarily neglecting current drawn by control circuit 416).

Control circuit 416 may control the LED modules through three control lines: control line 432 for the first row, control line 434 for the second row, and control line 436 for the third row. As previously discussed, it is convenient to daisy chain LED modules into rows, and it is convenient to control these rows by using three control lines (432, 434, and 436).

In another embodiment (not shown), two VRs may be used, each rated at 30 amps. This case has symmetric regulation (each VR rated at 30 amps), but cannot have balanced distribution (because 15 LED modules are not evenly divisible by 2). In this case, the 15 LED modules may be divided into a first group of 8 LED modules powered by the first VR, and a second group of 7 LED modules powered by the second VR. The second VR may be used to power 5 volt circuits such as control circuit 416, because the second VR is powering less LED modules.

In another embodiment (not shown), two VRs may be used, the first VR rated at 30 amps and the second VR rated at 20 amps. This case totals 50 rated amps (30+20), whereas the above cases total 60 rated amps (20+20+20, or 30+30). This relatively small decrease (17%) in total rated amps may reduce problems with blowing 15 amp fuses. This case has asymmetric regulation (first VR rating not equal to second VR rating), but may have balanced distribution. Specifically, if nine LED modules are powered by the 30 amp VR, and 6 LED modules are powered by the 20 amp VR, then each LED module is allocated 3.33 rated amps (balanced distribution). In this case, any other circuits that draw 5 volts (such as control circuit 416) may draw from the 30 amp VR (leading to a slightly unbalanced distribution).

Figure 20:
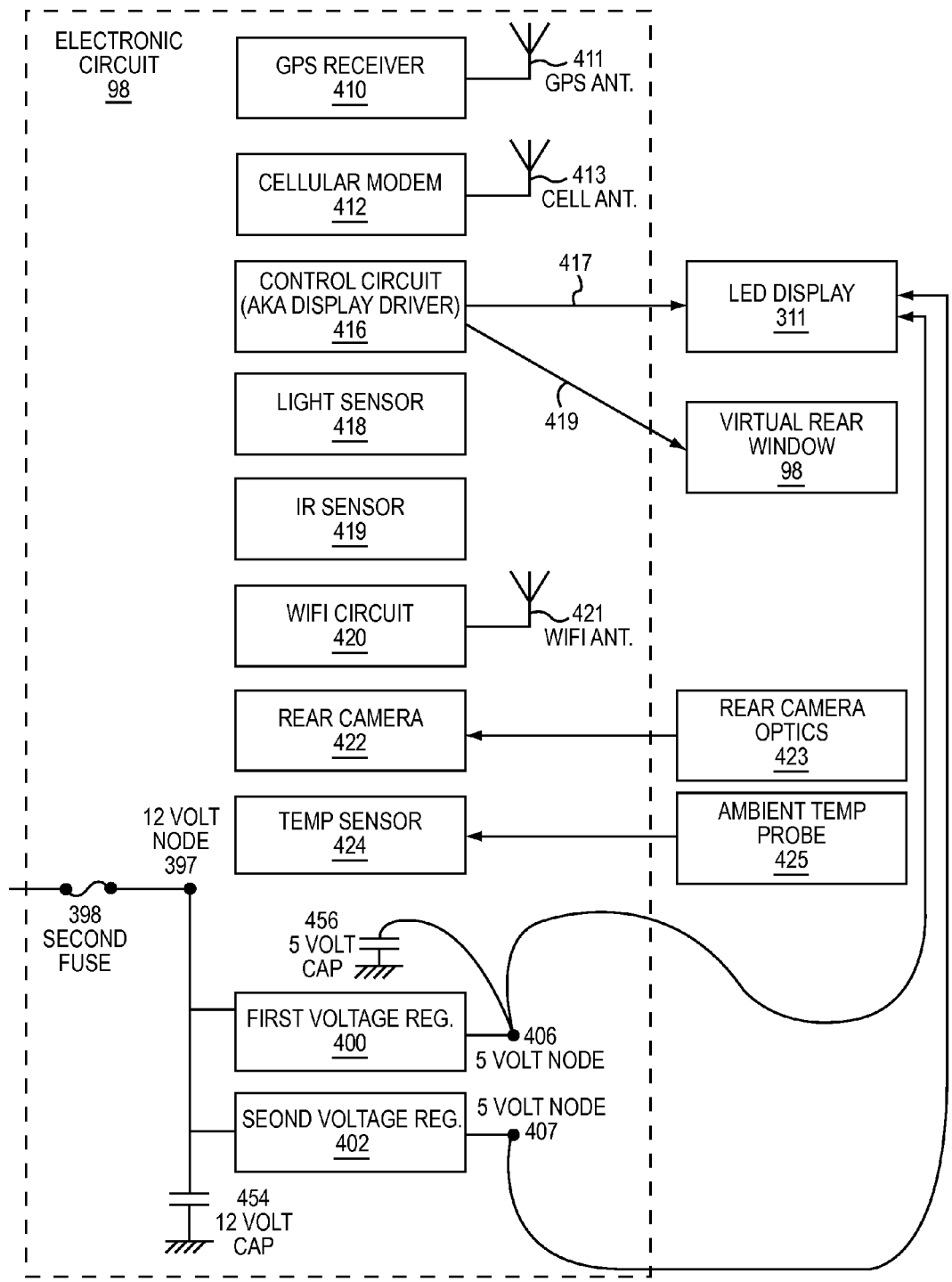
FIG. 20 illustrates electronic circuit 96

FIG. 20 illustrates electronic circuit 98. Electronic circuit 98 includes many components, some of which are powered by 12 volts, and some by 5 volts. Further, these components may communicate to each other through dedicated cables (not shown) or through common buses (not shown). In FIG. 20, some or all of the many components may be connected by a common bus for communication. Some of components may communicate only with one other component, such as light sensor 418 may be only in communication with control circuit 416. Communications components GPS receiver 410, WIFI circuit 420, and cellular modem 412 may be only in communication with a communications circuit (not shown).

Starting from the top of FIG. 20, GPS (Global Positioning System) Receiver 410 is coupled to GPS antenna 411 for receiving GPS signals from GPS satellites. GPS antenna 411 may extend towards the rear windshield (not shown) for improved reception.

GPS receiver 410 may be operated continuously, or in regular intervals (e.g., each 15 minutes), or only upon command.

Cellular modem 412 is coupled to cellular antenna 413, and may communicate with central server 270, as previously described. Cellular modem 412 is a type of communication circuit through which images may be delivered. IR sensor 419, and WIFI circuit 420 are also communication circuits.

Control circuit 416 (aka display driver) sends images to LED display 311 through control lines 417. Control circuit 416 may store multiple images or advertisements, and then provide a slideshow of those images. Additional images may be supplied by central server 270, and different stored images may be selected for the slide shown by central server 270. These communications may occur through cellular modem 412, or through WIFI circuit 420, or through IR sensor 419, or by a hard wire connection (not shown), or by other means.

Further, images may be selected by a user, such as: EMERGENCY, SEND HELP; or OUT OF GAS; or YOU ARE FOLLOWING TOO CLOSE; or PLEASE PASS ME NOW; or DANGER, DO NOT PASS; or WIDE LOAD. These images may be selected from a set of predetermined images, or may be generated from text supplied by the user. The user may be the driver of the vehicle. This selection may be performed by the user using a smart phone (or similar device) to communicate with display panel 30 (possibly through central server 270).

Also, images may be synchronized with operation of the vehicle. For example, LED display 311 may flash red like a supplemental brake light. Alternatively, portions of the display may flash like supplemental turn signals (or like supplemental hazard flashers). Under hard braking conditions, a supplemental brake light image may supersede an advertising image. Taxis in New York would find this feature very useful.

Control circuit 416 may also send images to virtual rear window 98 through control line 419. These images may be images obtained from rear camera 422, such that virtual rear window 99 provides an image corresponding to what would be visible through the rear window (if it were not blocked). Alternatively, these images may be advertisements, or may be video such as music videos obtained from stored media (not shown) or from satellites (not shown).

Further, a front camera (not shown) may be used to generate an image of what is in front of the vehicle carrying display panel 30, such that a following vehicle is not visually impaired by the vehicle carrying display panel 30. Alternatively, a car camera (not shown) may generate an image equivalent to what would be seen by a following vehicle if display panel 30 was not present, thus turning LED display 311 into a virtual rear windshield for the following driver.

One profitable use for display panel 30 is to generate revenue by displaying advertisements. However, many of the above mentioned uses may be provided as an added value (for up to perhaps 6 minutes per hour), or may be provided upon extra payments. Alternatively, display panel 30 may be sold, and then the user may use display panel 30 at the user's discretion.

Light sensor 418 may be located at the side of display panel 30 to measure ambient light, or may be located externally (not shown). Brightness of ambient light may be automatically used to adjust the brightness of LED display 311. For example, if light sensor 418 senses bright sunlight (10,000 nits), then the brightness of LED display 311 may be set at 4,500 to 6,000 nits. A nit is a unit of illumination equivalent to one candela per square meter ($cd/m^2$). For safety reasons, these daytime values are kept less than that of vehicle brake lights.

In contrast, LED display 311 may be dimmed to 1,200 nits at night (or in cloudy weather), so that following drivers are not distracted too much by LED display 311. This logic may be described as "automatic corresponding brightness control," but operates in a fashion opposite to most other automatic systems. For example, nightlights in a home turn on when it becomes night (acting inversely to the measured ambient light). In contrast, automatic corresponding brightness control dims LED display 311 at night.

IR (infrared) sensor 419 may be used by a technician to communicate with display panel 30, and to troubleshoot display panel 30.

WIFI circuit 420 is coupled to WIFI antenna 421, and may be used to control display panel 30 locally, in the same way that central server 270 may controls display panel 30. This circuit may be removed after cellular modem 412 is operational.

Rear camera 422 may be coupled with externally located rear camera optics 423, or may have optics internally. Rear camera 422 may be used to provide a rear view to a driver's navigation device, or may be used to provide a virtual rear view for virtual rear window 98.

Temperature sensor 424 may measure ambient temperature outside of the vehicle through ambient temperature probe 425 to prevent blowing externally located fuses by reducing brightness of LED display 311 in extremely hot weather. Alternatively (or additionally) ambient temperature probe 425 may measure ambient temperature in display panel 30 or in LED display 311 to prevent overheating by decreasing brightness or by shutting down.

Voltage regulators 400 and 402 are discussed in detail in previous figures. In one embodiment, these voltage regulators should not have their outputs directly coupled because their outputs are asynchronous.

12 volt capacitor 454 helps to damp fluctuations caused by various components turning on and off, such as GPS receiver 410 turning on or off, or such as vehicle lights being turned on or off. Similarly, 5 volt capacitor 456 tends to damp fluctuations caused by a new image being displayed in LED display 311.

FIG. 21 illustrates a relatively simple first set of communications 460 between central server 270 and display panel 30 that is independent of location. In step 462, central server 270 sends a first set of images to display panel 30 for an advertising slideshow. A slideshow may include 10 or 12 images for 6 to 8 seconds per image.

In step 464, display panel 30 acknowledges receiving the first set of images. Appropriate handshaking and acknowledgment communications are implied throughout this first set of communications.

In step 465, display panel 30 displays the first set of images.

In step 466, display panel 30 may record data regarding displaying the first set of images. This data may include: images displayed, hours of display, locations of vehicle during display, and velocity of vehicle during display.

In step 467, central server 270 requests data.

In step 468, display panel 30 reports data.

In step 470, central server 270 creates an appropriate bill based upon received data.

In step 472, central server 270 sends a second set of images. In this fashion, sets of images may be regularly updated once per hour or once per day. Further, advertisers may be billed based upon the number of hours that their advertisement was actually displayed.

FIG. 22 illustrates a second set of communications 480 between central server 270 and display panel 30 based upon requesting location after a predetermined period of time.

In step 482, central server 270 requests the location of display panel 30.

In step 484, display panel 30 determines its location using GPS receiver 410. GPS receiver 410 may be kept on at all times, or may be triggered only upon receiving a query. Alternatively, display panel 30 may determine its location based upon which base station (e.g., 282 or 284) is communicating with cellular modem 412 of display panel 30. This determination may be performed continuously, or only upon receiving a query.

In step 486, display panel 30 reports its location.

In step 488, central server 270 sends a first set of images. This may be a single image, or multiple images for a slideshow. This set of images may be based upon the location of display panel 30, and/or upon the time of day, and/or upon the day of the week.

In step, 490, display panel 30 displays the first set of images.

In step 492, central server 270 requests a location after a predetermined period of time has passed. For example, central server 270 may request locations once per hour, or once every 15 minutes.

In step 494, display panel 30 determines its location.

In step 496, display panel 30 reports its location.

In step 498, central server 270 may send a second set of images, or may do nothing.

In one embodiment (see FIG. 13), an area may be mapped into multiple geographic zones (260, 262, and 264). The images sent to display panel 30 may vary with respect to which zone display panel 30 is in. A first set for zone 260, and a second set for zone 264.

Alternatively, images may vary with respect to which communication module display panel 30 is in, or, more accurately, with respect to which base station (282 or 284) display panel 30 is in. In this case, zones are defined as communication cells, and no GPS is required.

In one embodiment, not shown, display panel 30 regularly determines autonomously whether or not it has entered a new zone, and then notifies central server 270 when it has entered a new zone. This embodiment requires a relatively intelligent display panel 30. However, in other embodiments display panel 30 may be relatively dumb, effectively a dumb client.

FIG. 23 illustrates a third set of communications 520, wherein requests are made in a predictive fashion.

In step 522, central server 270 requests the location of display panel 30.

In step 524, display panel 30 determines its location using GPS receiver 410. GPS receiver 410 may be kept on at all times, or may be triggered only upon receiving a query. Alternatively, display panel 30 may determine its location based upon which base station (e.g., 282 or 284) is communicating with cellular modem 412 of display panel 30. This determination may be performed continuously, or only upon receiving a query.

In step 526, display panel 30 reports its location. Display panel 30 may also report its velocity and direction (particularly if it is connected to a car navigation system).

In step 528, central server 270 sends a first set of images. This may be a single image, or multiple images for a slideshow. This set of images may be based upon the location of display panel 30, and/or upon the time of day, and/or upon the day of the week.

In step, 530, display panel 30 displays the first set of images.

In step 531, central server 270 uses location data to calculate a period of time to wait before requesting position again. This calculation may be based upon:

A) a single location. For example, if the single location is near a border between two zones, then the wait time may be small. If the single location is far from a border, then the wait time may be large.

B) two locations and a delta time. If central server 270 has received a first location and a first time, and a second location and a second time, then central server 270 calculates an estimated time for crossing a border (ETCB) into another zone. After the estimated time, central server 270 queries (requests a location). A minimum wait time may be arbitrarily determined, so that a taxi crisscrossing a border will not consume too much processing power of central server 270. The first time is associated with the first location, and may be the time at which the first location was requested, or the time at which the first location was measured, or the time at which the central server received the first location. The second time is similarly associated with the second location.

If a new zone has been entered, then a new set of images may be sent. Central server 270 then calculates a new ETCB. Even if no new zone has been entered, central server 270 still calculates a new ETCB.

C) one location and a velocity. If central server 270 receives a single location and a velocity (perhaps a velocity for a car navigation device), then central server 270 calculates ETCB based upon that information.

D) historical data. Central server 270 may also consider historical data of display panel 30 for predicting ETCB. For example, a bus with display panel 30 may travel exactly the same route every day.

In step 532, at the ETCB, central server 270 requests location from display panel 30.

In step 534, display panel 30 determines location.

In step 536, display panel 30 reports location.

In step 538, central server 270 determines whether a new zone has been entered. Central server 270 also calculates a new ETCB.

In step 540, a new zone has been entered, so central server 270 sends a second set of images.

Those skilled in the art will recognize improvements and modifications to the preferred embodiments of the present disclosure. All such improvements and modifications are considered within the scope of the concepts disclosed herein and the claims that follow.

What is claimed is:

1. A display assembly for displaying messages out of a rear window of a vehicle, the display assembly comprising:
   a display panel; and
   a support assembly configured to support the display panel,
   wherein the support assembly includes:
      a first hinge including:
         a first flap having a first hole,
         a pivot, and
         a second flap having a second hole and a third hole, and
      a first strap including:
         a fourth hole and a fifth hole located at a hinge end of the first strap, and
         sixth hole located at a cross beam end of the first strap, and
      wherein the second hole of the second flap is fastened by a first fastener to the fourth hole of the first strap, and
      wherein the third hole of the second flap is fastened by a second fastener to the fifth hole of the first strap.

2. The display assembly of claim 1, wherein the first strap is made of metal.

3. The display assembly of claim 1,
   wherein the first strap has an approximately 90 degree bend near the hinge end of the first strap;
   wherein a horizontal strap portion of the first strap rests on top of a vehicle horizontal surface;
   and wherein a second vertical strap portion of the strap is located behind a rear seat of the vehicle and is fastened to a cross beam by at least one vertical strap portion fastener passing through the strap, through a car vertical surface, and into the crossbeam.

4. The display assembly of claim 3,
   wherein the first strap is grade 316 stainless steel, and
   wherein the first strap has the following dimensions:
      a length between 8 inches and 16 inches, inclusively,
      a width between half of an inch and 4 inches, inclusively, and
      a thickness between 14 gauge and 20 gauge, inclusively.

* * * * *